US012211667B2

(12) United States Patent
Bloom et al.

(10) Patent No.: US 12,211,667 B2
(45) Date of Patent: *Jan. 28, 2025

(54) HIGH FRAMERATE AND HIGH DYNAMIC RANGE ELECTRON MICROSCOPY

(71) Applicant: Integrated Dynamic Electron Solutions, Inc., Pleasanton, CA (US)

(72) Inventors: Ruth Bloom, Pleasanton, CA (US); Sang Tae Park, Pleasanton, CA (US); Bryan Reed, Pleasanton, CA (US); Daniel Masiel, Pleasanton, CA (US)

(73) Assignee: Integrated Dynamic Electron Solutions, Inc., Pleasanton, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/367,066

(22) Filed: Sep. 12, 2023

(65) Prior Publication Data

US 2024/0105418 A1    Mar. 28, 2024

Related U.S. Application Data

(63) Continuation of application No. 16/939,576, filed on Jul. 27, 2020, now Pat. No. 11,804,359, which is a
(Continued)

(51) Int. Cl.
*H01J 37/26* (2006.01)
*H01J 37/147* (2006.01)
*H01J 37/244* (2006.01)

(52) U.S. Cl.
CPC .......... *H01J 37/26* (2013.01); *H01J 37/1474* (2013.01); *H01J 37/244* (2013.01); *H01J 2237/2802* (2013.01); *H01J 2237/2804* (2013.01)

(58) Field of Classification Search
CPC ...... H01J 37/1474; H01J 37/244; H01J 37/26; H01J 2237/2802; H01J 2237/2804
See application file for complete search history.

(56) References Cited

U.S. PATENT DOCUMENTS 3,887,841 A    6/1975  Huston
4,565,923 A    1/1986  Huston
(Continued)

FOREIGN PATENT DOCUMENTS

WO   WO-2015029200 A1 *  3/2015  .............. H01J 37/21
WO   WO-2019028129 A1     2/2019
WO   WO-2021007360 A1     1/2021

OTHER PUBLICATIONS

EP20836714.4 Extended European Search Report dated Jul. 10, 2023.
(Continued)

*Primary Examiner* — David E Smith
(74) *Attorney, Agent, or Firm* — Wilson Sonsini Goodrich & Rosati

(57) ABSTRACT

Methods and systems for acquiring transmission electron microscope video data on a rolling-shutter detector at an enhanced frame rate and without temporal distortions are described. Also described are methods to enhance the dynamic range of image and diffraction data acquired using a transmission electron microscope. The disclosed methods and systems may also be applicable to photon detection and imaging systems.

23 Claims, 11 Drawing Sheets

Related U.S. Application Data continuation of application No. PCT/US2020/041266, filed on Jul. 8, 2020.

(60) Provisional application No. 62/872,645, filed on Jul. 10, 2019.

(56) References Cited

U.S. PATENT DOCUMENTS

| | | | |
|---|---|---|---|
| 4,736,110 | A | 4/1988 | Awamura |
| 9,165,743 | B2 | 10/2015 | Reed et al. |
| 9,451,177 | B2 | 9/2016 | Raskar et al. |
| 10,018,824 | B2 | 7/2018 | Reed |
| 11,804,359 | B2 * | 10/2023 | Bloom ............... H01J 37/26 |
| 2003/0116717 | A1 * | 6/2003 | Knippelmeyer ...... H01J 37/244 250/397 |
| 2008/0210863 | A1 | 9/2008 | Pinna et al. |
| 2015/0235800 | A1 * | 8/2015 | Reed ............... H01J 37/22 250/311 |
| 2016/0276130 | A1 | 9/2016 | Mele et al. |
| 2017/0013220 | A1 | 1/2017 | Staker et al. |
| 2017/0207059 | A1 | 7/2017 | Trevor et al. |
| 2019/0204579 | A1 | 7/2019 | Reed |
| 2020/0294757 | A1 | 9/2020 | Kawamoto et al. |

OTHER PUBLICATIONS

Oxford Instruments "Rolling and Global Shutter" (available at https://web.archive.org/web/20190501134132/https://andor.oxinst.com/learning/view/article/rolling-and-global-shutter) (2019). 10 pages.

PCT/US2020/041266 International Search Report and Written Opinion dated Oct. 13, 2020.

Reed et al. Next Steps for Compressively Sensed Video in Transmission Electron Microscopy. Microsc Microanal 24 (Supp 1), pp. 494-495 (2018).

U.S. Appl. No. 16/939,576 Notice of Allowance dated Jun. 14, 2023.

U.S. Appl. No. 16/939,576 Notice of Allowance dated Sep. 18, 2023.

U.S. Appl. No. 16/939,576 Office Action dated Dec. 21, 2021.

U.S. Appl. No. 16/939,576 Office Action dated Feb. 21, 2023.

\* cited by examiner

FIG. 4A
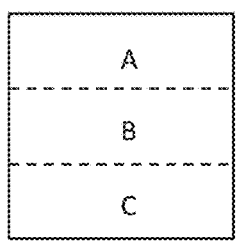
FIG. 4B
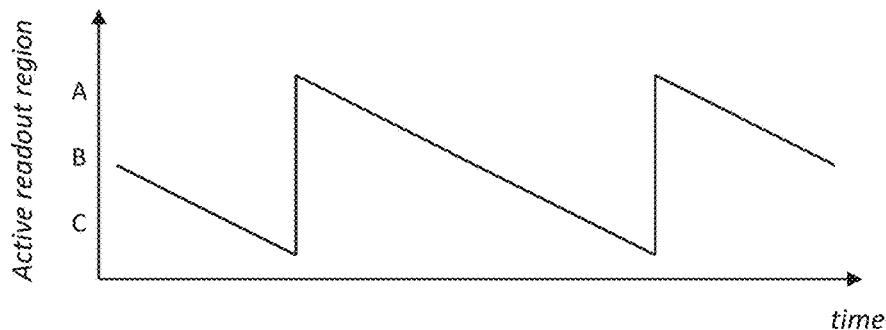
FIG. 4C
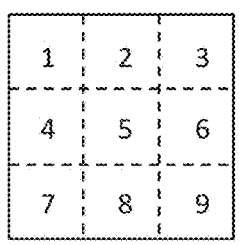
FIG. 4D
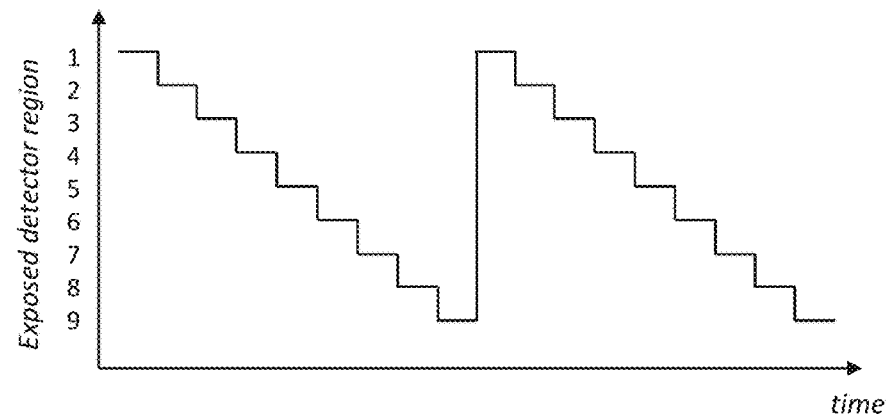
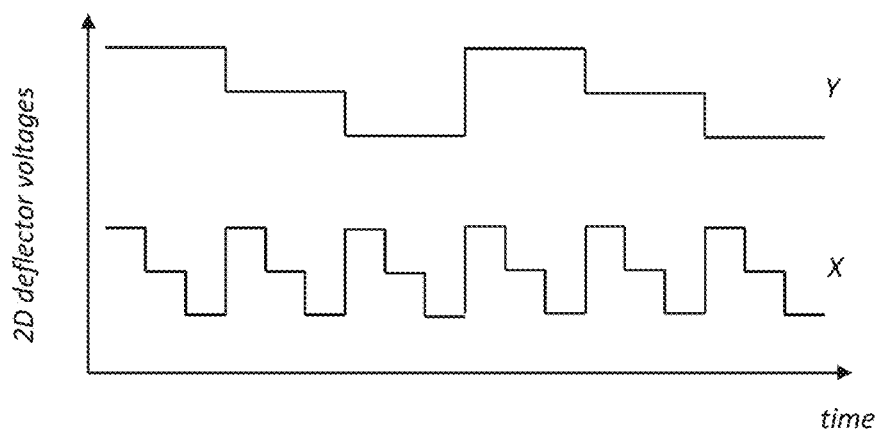
FIG. 4E FIG. 10A
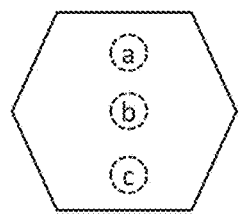
FIG. 10B
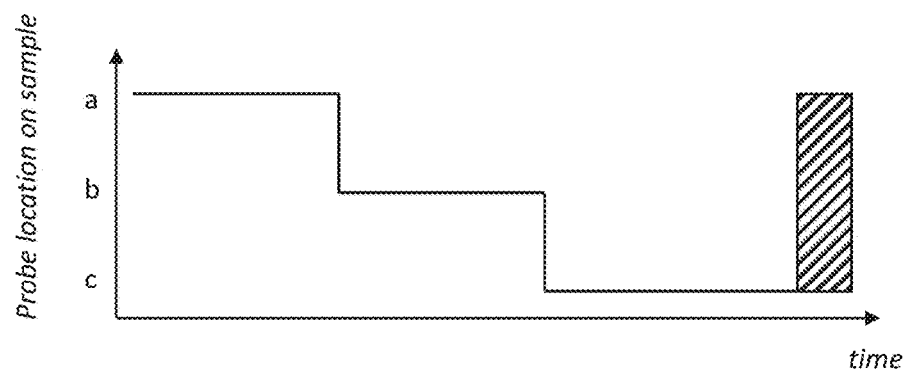
FIG. 10C
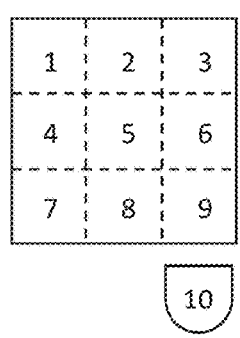
FIG. 10D
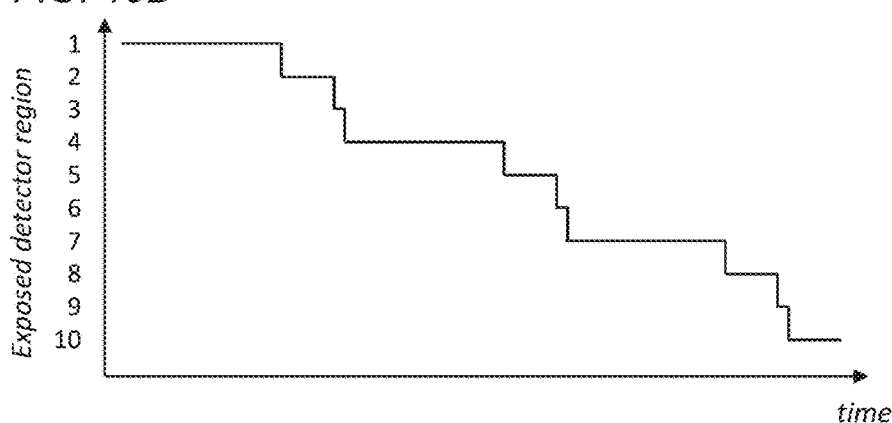
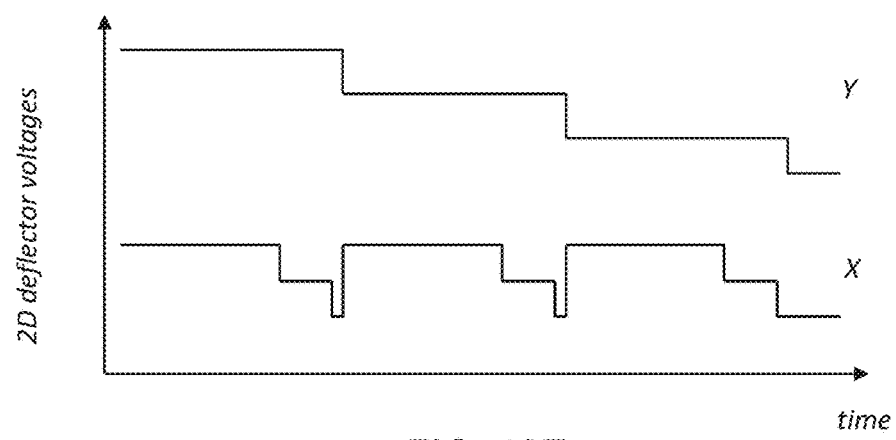
FIG. 10E

HIGH FRAMERATE AND HIGH DYNAMIC RANGE ELECTRON MICROSCOPY

CROSS-REFERENCE

This application is a continuation of U.S. patent application Ser. No. 16/939,576, filed Jul. 27, 2020, which is a continuation of International Application No. PCT/US2020/041266, filed Jul. 8, 2020, which claims the benefit of U.S. Provisional Application No. 62/872,645, filed on Jul. 10, 2019, each of which is incorporated herein by reference in their entirety for all purposes.

STATEMENT AS TO FEDERALLY SPONSORED RESEARCH

This invention was made with the support of the United States government under SBIR Phase IIA Award No. DE-SC0013104 from the U.S. Department of Energy.

BACKGROUND

Systems and methods to acquire video data on a Transmission Electron Microscope (TEM) at high framerate and/or high dynamic range are described. Much like image detectors in other applications, state-of-the-art video detectors in TEMs can run in either rolling shutter or global shutter timing modes. A 'rolling shutter' readout mode offers close to 100% duty cycle and maximum framerate, however temporal distortions make videos of fast-moving objects difficult to interpret because different regions of the camera read out at different times. 'Global shutter' readout is synchronized across all pixels and does not suffer from these distortions; however, the duty cycle is reduced because pixels are blocked during readout, thereby resulting in a loss of useable signal while continuing to expose the sample to the electron beam. The maximum achievable framerate is also typically slower for global shutter readout.

SUMMARY

Applicant has recognized that there is an unmet need for new methods and systems for acquiring high framerate and high dynamic range image data that reduce or eliminate temporal distortion while enabling high duty cycle operation. New methods to acquire video data on a rolling-shutter detector at an enhanced frame rate and without temporal distortions are described in the present disclosure. Also described are methods to enhance the dynamic range of measurements in electron microscopy. The disclosed methods may also be applicable to photon detection and optical imaging systems.

Disclosed herein are methods for acquiring transmission electron microscope data, the methods comprising: a) providing a transmission electron microscope comprising a two-dimensional deflector configured to deflect electrons transmitted or scattered by a sample positioned at a sample plane, wherein the two-dimensional deflector is positioned between the sample plane and a two-dimensional detector array; b) modulating a deflector control signal such that the deflected electrons are sequentially deflected to a series of two or more sub-regions of the two-dimensional detector array, thereby capturing a data set corresponding to a pattern of the electrons deflected to each of the two or more sub-regions; and c) synchronizing the modulation of the deflector control signal with a detector array read-out signal such that each of the two or more sub-regions captures a data set within each of a series of recurring detector array read-out cycles.

In some embodiments, the methods for acquiring transmission electron microscope data may comprise: a) providing a transmission electron microscope comprising a two-dimensional deflector configured to deflect electrons transmitted or scattered by a sample positioned at a sample plane, wherein the two-dimensional deflector is positioned between the sample plane and a two-dimensional detector array; and b) modulating a deflector control signal such that the deflected electrons are sequentially deflected to a series of two or more sub-regions of the two-dimensional detector array, thereby capturing a data set corresponding to a pattern of the electrons deflected to each of the two or more sub-regions; wherein a sensitivity of the two or more sub-regions of the two-dimensional detector array, or a dwell time for deflecting electrons to each of the two or more sub-regions, is individually adjusted.

Also disclosed are methods for acquiring image data, the methods comprising: a) providing an optical system comprising a two-dimensional deflector configured to deflect photons transmitted, reflected, or scattered by an object positioned at a sample plane or focal plane, wherein the two-dimensional deflector is positioned between the sample plane or focal plane and a two-dimensional detector array; b) modulating a deflector control signal such that the deflected photons are sequentially deflected to a series of two or more sub-regions of the two-dimensional detector array, thereby capturing a data set corresponding to a pattern of the photons deflected to each of the two or more sub-regions; and c) synchronizing the modulation of the deflector control signal with a detector array read-out signal such that each of the two or more sub-regions captures a data set within each of a series of recurring detector array read-out cycles.

In some embodiments, the methods for acquiring image data may comprise: a) providing an optical system comprising a two-dimensional deflector configured to deflect photons transmitted, reflected, or scattered by an object positioned at a sample plane or focal plane, wherein the two-dimensional deflector is positioned between the sample plane or focal plane and a two-dimensional detector array; and b) modulating a deflector control signal such that the deflected photons are sequentially deflected to a series of two or more sub-regions of the two-dimensional detector array, thereby capturing a data set corresponding to a pattern of the photons deflected to each of the two or more sub-regions; wherein a sensitivity of the two or more sub-regions of the two-dimensional detector array, or a dwell time for deflecting photons to each of the two or more sub-regions, is individually adjusted.

In some embodiments, the two dimensional deflector is a two-dimensional electrostatic deflector. In some embodiments, the two-dimensional deflector is a two-dimensional electromagnetic deflector. In some embodiments, the two-dimensional deflector is a moving mirror or prism. In some embodiments, the two or more sub-regions comprise sub-regions of a single two-dimensional detector. In some embodiments, the two or more sub-regions comprise different detectors within a two-dimensional detector array. In some embodiments, the two-dimensional detector array comprises a charge-coupled device (CCD) image sensor, a complementary metal oxide semiconductor (CMOS) image sensor, an electron direct detection (EDD) camera, or a time-of-flight (ToF) image sensor, and wherein the modulation of the deflector control signal is synchronized with a rolling shutter synchronization signal for a CCD, CMOS, EDD, or ToF camera such that deflected electrons or photons are directed to sub-regions that are not actively being read out. In some embodiments, the modulation of the deflector control signal is continuously synchronized with a rolling shutter synchronization signal for a CCD, CMOS, EDD, or ToF camera such that deflected electrons or photons are directed to sub-regions that are not actively being read out. In some embodiments, a duty cycle for data acquisition is at least 90% without incurring temporal distortion of the data. In some embodiments, a duty cycle for data acquisition is at least 95% without incurring temporal distortion of the data. In some embodiments, a duty cycle for data acquisition is at least 98% without incurring temporal distortion of the data. In some embodiments, the data set captured by each of the two or more sub-regions comprises a frame of image or diffraction data. In some embodiments, the method may further comprise processing the image or diffraction data for the two or more sub-regions to create video data comprising a framerate that is faster than a read-out rate for the CCD, CMOS, or ToF camera. In some embodiments, the framerate of the video data set is at least 4× faster than the read-out rate of the CCD, CMOS, or ToF camera. In some embodiments, the framerate of the video data set is at least 8× faster than the read-out rate of the CCD, CMOS, or ToF camera. In some embodiments, the framerate of the video data set is at least 16× faster than the read-out rate of the CCD, CMOS, or ToF camera. In some embodiments, the framerate of the video data set is at least 32× faster than the read-out rate of the CCD, CMOS, or ToF camera. In some embodiments, a switching time for the two-dimensional deflector is less than 10 microseconds. In some embodiments, a switching time for the two-dimensional deflector is less than 1 microsecond. In some embodiments, a switching time for the two-dimensional deflector is less than 100 nanoseconds. In some embodiments, a switching time for the two-dimensional deflector is less than 10 nanoseconds. In some embodiments, the deflector control signal is modulated such that a dwell time for deflecting electrons or photons to each of the two or more sub-regions is the same. In some embodiments, the deflector control signal is modulated such that a dwell time for deflecting electrons or photons to each of the two or more sub-regions is different for at least one of the two or more sub-regions. In some embodiments, a dwell time for deflecting electrons or photons to the two or more sub-regions ranges from about 1 microsecond to about 100 milliseconds. In some embodiments, the deflector control signal is modulated such that a dwell time for deflecting electrons or photons to at least one of the two or more sub-regions is zero, and the data set captured by the at least one sub-region comprises a dark current data set. In some embodiments, each data set captured by the two or more two-dimensional sub-regions comprises image or diffraction data, and is further processed to provide a single frame of image or diffraction data having a higher dynamic range than that of the two-dimensional detector array. In some embodiments, each of the two or more sub-regions of the two-dimensional detector array comprises an individual detector. In some embodiments, a sensitivity of each of the two or more individual detectors or a saturation level for each of the two or more individual detectors is individually adjusted. In some embodiments, the sensitivity of the two or more individual detectors is adjusted electronically. In some embodiments, the sensitivity of the two or more individual detectors is adjusted by spatial filtering or masking. In some embodiments, the two or more individual detectors comprise two or more detectors comprising different functionalities or different performance specifications. In some embodiments, the two or more detectors comprise CCD cameras, CMOS cameras, dark-field STEM detectors, Faraday cups, quad photodiodes, annular dark field detectors, bright field detectors, universal detectors, or any combination thereof. In some embodiments, at least one of the two or more individual detectors is positioned at different distance from the sample plane or focal plane. In some embodiments, the data sets captured by the two or more detectors are compiled to create a multimodal data set comprising image data, electron beam current data, electron beam alignment data, segmented dark field data, or any combination thereof. In some embodiments, the data sets captured by the two or more sub-regions are processed to correct for distortions introduced by the deflection step.

Disclosed herein are systems for acquiring transmission electron microscopy data, the systems comprising: a) a transmission electron microscope; b) a two-dimensional deflector configured to deflect electrons transmitted or scattered by a sample, wherein the two-dimensional deflector is positioned between a sample plane and a two-dimensional detector array within the transmission electron microscope; c) a deflector control system configured to modulate a deflector control signal such that the deflected electrons are sequentially deflected to a series of two or more sub-regions of the two-dimensional detector array, thereby capturing a data set corresponding to a pattern of electrons deflected to each of the two or more sub-regions; wherein the deflector control signal is synchronized with a detector array read-out signal such that each of the two or more two-dimensional sub-regions captures a data set within each of a series of recurring detector array read-out cycles.

In some embodiments, the disclosed systems for acquiring transmission electron microscopy data may comprise: a) a transmission electron microscope; b) a two-dimensional deflector configured to deflect electrons transmitted or scattered by a sample, wherein the two-dimensional deflector is positioned between a sample plane and a two-dimensional detector array within the transmission electron microscope; c) a deflector control system configured to modulate a deflector control signal such that the deflected electrons are sequentially deflected to a series of two or more sub-regions of the two-dimensional detector array, thereby capturing a data set corresponding to a pattern of electrons deflected to each of the two or more sub-regions; wherein a sensitivity of the two or more sub-regions of the two-dimensional detector array, or a dwell time for deflecting electrons to each of the two or more sub-regions, is individually adjustable.

Also disclosed herein are systems for acquiring image data, the systems comprising: a) an optical system comprising a two-dimensional deflector configured to deflect photons transmitted, reflected, or scattered by an object positioned at a sample plane or focal plane, wherein the two-dimensional deflector is positioned between the sample plane or focal plane and a two-dimensional detector array; and b) a deflector control system configured to modulate a deflector control signal such that the deflected photons are sequentially deflected to a series of two or more sub-regions of the two-dimensional detector array, thereby capturing a data set corresponding to a pattern of the photons deflected to each of the two or more sub-regions; wherein the deflector control signal is synchronized with a detector array read-out signal such that each of the two or more sub-regions captures a data set within each of a series of recurring detector array read-out cycles.

In some embodiments, the disclosed systems for acquiring image data may comprise: a) an optical system comprising a two-dimensional deflector configured to deflect photons transmitted, reflected, or scattered by an object positioned at a sample plane or focal plane, wherein the two-dimensional deflector is positioned between the sample plane or focal plane and a two-dimensional detector array; and b) a deflector control system configured to modulate a deflector control signal such that the deflected photons are sequentially deflected to a series of two or more sub-regions of the two-dimensional detector array, thereby capturing a data set corresponding to a pattern of the photons deflected to each of the two or more sub-regions; wherein a sensitivity of the two or more sub-regions of the two-dimensional detector array, or a dwell time for deflecting photons to each of the two or more sub-regions, is individually adjustable.

In some embodiments, the system further comprises a processor configured to collect and analyze the data sets captured by the two or more sub-regions. In some embodiments, the two-dimensional deflector is a two-dimensional electrostatic deflector. In some embodiments, the two-dimensional deflector is a two-dimensional electromagnetic deflector. In some embodiments, the two-dimensional deflector is a moving mirror or prism. In some embodiments, the two or more sub-regions comprise sub-regions of a single two-dimensional detector. In some embodiments, the two or more sub-regions comprise different detectors within a two-dimensional detector array. In some embodiments, the two-dimensional detector array comprises a charge-coupled device (CCD) image sensor, a complementary metal oxide semiconductor (CMOS) image sensor, an electron direct detection (EDD) image sensor, or a time-of-flight (ToF) image sensor, and wherein the modulation of the deflector control signal is synchronized with a rolling shutter synchronization signal for a CCD, CMOS, EDD, or ToF camera such that deflected electrons or photons are directed to sub-regions that are not actively being read out. In some embodiments, the modulation of the deflector control signal is continuously synchronized with a rolling shutter synchronization signal for a CCD, CMOS, EDD, or ToF camera such that deflected electrons or photons are directed to sub-regions that are not actively being read out. In some embodiments, a duty cycle for data acquisition is at least 90% without incurring temporal distortion of the data. In some embodiments, a duty cycle for data acquisition is at least 95% without incurring temporal distortion of the data. In some embodiments, a duty cycle for data acquisition is at least 98% without incurring temporal distortion of the data. In some embodiments, each data set captured by the two or more sub-regions comprises a single frame of image or diffraction data. In some embodiments, the image or diffraction data for the two or more sub-regions is processed to create a video data set comprising a framerate that is faster than a read-out rate for the CCD, CMOS, or ToF camera. In some embodiments, the framerate of the video data set is at least 4× faster than the framerate of the CCD, CMOS, or ToF camera. In some embodiments, the framerate of the video data set is at least 8× faster than the framerate of the CCD, CMOS, or ToF camera. In some embodiments, the framerate of the video data set is at least 16× faster than the framerate of the CCD, CMOS, or ToF camera. In some embodiments, the framerate of the video data set is at least 32× faster than the framerate of the CCD, CMOS, or ToF camera. In some embodiments, a switching time for the two-dimensional deflector is less than 10 microseconds. In some embodiments, a switching time for the two-dimensional deflector is less than 1 microsecond. In some embodiments, a switching time for the two-dimensional deflector is less than 100 nanoseconds. In some embodiments, a switching time for the two-dimensional deflector is less than 10 nanoseconds.

In some embodiments, the deflector control signal is modulated such that a dwell time for the deflected electrons or photons at each of the two or more sub-regions is the same. In some embodiments, the deflector control signal is modulated such that a dwell time for the deflected electrons or photons at each of the two or more sub-regions is different for at least one of the two or more sub-regions. In some embodiments, a dwell time for deflecting electrons or photons to the two or more sub-regions ranges from about 1 microsecond to about 100 milliseconds. In some embodiments, the deflector control signal is modulated such that a dwell time for deflecting electrons or photons to at least one of the two or more sub-regions is zero, and the data set captured by the at least one sub-region comprises a dark current data set. In some embodiments, each data set captured by the two or more sub-regions comprises image or diffraction data, and is further processed to provide a single frame of image or diffraction data having a higher dynamic range than that of the two-dimensional detector array. In some embodiments, each of the two or more sub-regions of the two-dimensional detector array comprises an individual detector. In some embodiments, a sensitivity of each of the two or more individual detectors or a saturation level for each of the two or more individual detectors is individually adjustable. In some embodiments, the sensitivity of the two or more individual detectors is adjusted electronically. In some embodiments, the sensitivity of the two or more individual detectors is adjusted by spatial filtering or masking. In some embodiments, the two or more individual detectors comprise two or more detectors comprising different functionalities or different performance specifications. In some embodiments, the two or more different detectors comprise CCD cameras, CMOS cameras, darkfield STEM detectors, Faraday cups, quad photodiodes, annular dark field detectors, bright field detectors, universal detectors, or any combination thereof. In some embodiments, at least one of the two or more individual detectors is positioned at different distance from the sample plane or focal plane. In some embodiments, the data sets captured by the two or more detectors are compiled to create a multimodal data set comprising image data, electron beam current data, electron beam alignment data, segmented dark field data, or any combination thereof. In some embodiments, the data sets captured by the two or more sub-regions are processed to correct for distortions introduced by the deflection step.

INCORPORATION BY REFERENCE

All publications, patents, and patent applications mentioned in this specification are herein incorporated by reference in their entirety to the same extent as if each individual publication, patent, or patent application was specifically and individually indicated to be incorporated by reference in its entirety. In the event of a conflict between a term herein and a term in an incorporated reference, the term herein controls.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIGS. 4A-4E provide a non-limiting example of timing diagrams for synchronizing the electrostatic deflection of electrons in a TEM to expose different sub-regions of a two-dimensional detector, such as a CMOS camera, with a rolling shutter read-out signal for the two-dimensional detector. FIG. 4A: schematic illustration of read-out regions for a CMOS image sensor. FIG. 4B: timing diagram for row-by-row read-out from the image sensor. FIG. 4C: sub-regions of the image sensor as defined by a two-dimensional deflector. FIG. 4D: timing diagram for the sequence of exposures illustrated in FIG. 4C. FIG. 4E: timing diagram for the voltages applied between pairs of electrodes in a two-dimensional electrostatic deflector to implement the deflection pattern and timing depicted in FIGS. 4C and 4D.

FIGS. 10A-10E provide a non-limiting example of timing diagrams for controlling the electrostatic deflection of electrons in a TEM to expose different sub-regions of a two-dimensional detector or different detectors in a two-dimensional array of detectors. FIG. 10A: schematic illustration of probe beam locations on sample. FIG. 10B: timing diagram for scanning of probe beam across sample. FIG. 10C: schematic illustration of an array of 10 individual detectors. In some instances, detection regions 1-9 may be sub-regions of a single detector, e.g., a CMOS camera. FIG. 10D: timing diagram for the sequence of exposures illustrated in FIG. 10C, where the exposure time (dwell time) for different detectors/detector regions is different. FIG. 10E: timing diagram for the voltages applied between pairs of electrodes in a two-dimensional electrostatic deflector to implement the deflection pattern and timing depicted in FIGS. 10C and 10D.

DETAILED DESCRIPTION

Figure 1:
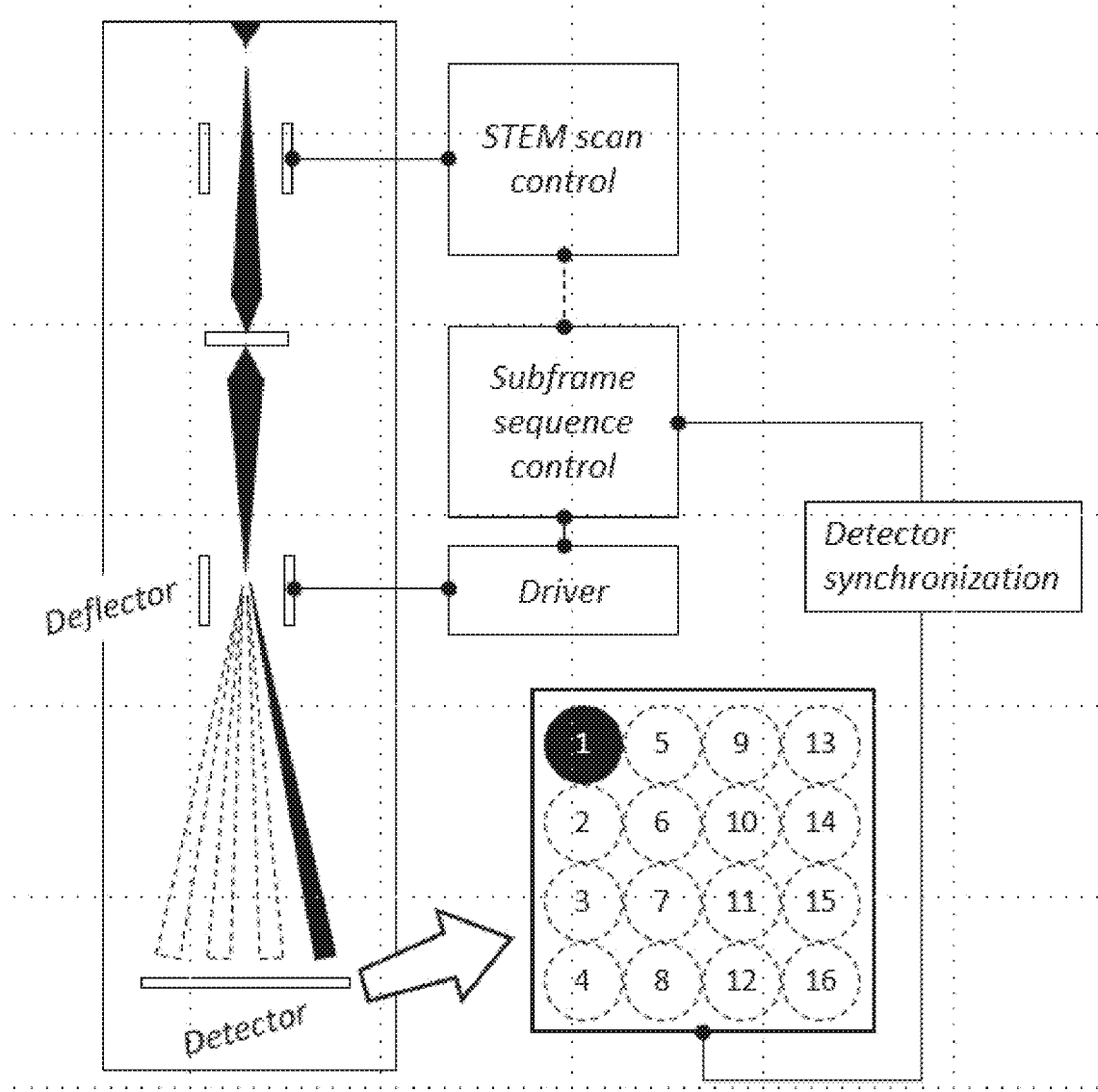
FIG. 1 provides a non-limiting example of a transmission electron microscope (TEM) configured for acquiring high framerate video data according to one aspect of the present disclosure.

Methods and systems for acquisition of high framerate (HFR) video data and/or high dynamic range (HDR) image or diffraction data in transmission electron microscopy are described. In some instances, the disclosed methods and systems may be applied to other image data acquisition modes, for example, optical microscopy or optical imaging. The disclosed methods and systems share a common feature in that, in each case, a fast two-dimensional deflector is used to sequentially deflect electrons or photons transmitted or scattered by a sample (or object) to each of a series of sub-regions of a two-dimensional detector with precise control of timing and spatial positioning. In some instances, the sub-regions may comprise sub-divisions of a single two dimensional detector, e.g., quadrants of a single CCD or CMOS image sensor. In some instances, the sub-regions may comprise individual detectors, e.g., individual CCD or CMOS image sensors, within a two-dimensional array of detectors.

In the case of high framerate video data acquisition, the fast switching of the two-dimensional deflector between different sub-regions of a detector, e.g., a CMOS camera sensor, and the precise timing and continuous synchronization of the two-dimensional deflector with a rolling shutter read-out of the CMOS camera, provides for ongoing acquisition of video data at a framerate that is higher than the read-out rate for the CMOS camera. The disclosed methods and systems may comprise the use of, e.g., a fast two-dimensional electrostatic or electromagnetic deflector to direct electrons to sub-regions of the camera that are not actively being read out, such that the camera's image sensor is divided into multiple sub-frames that acquire an image or diffraction pattern at different points in time. These sub-frames are continuously synchronized to the rolling shutter of the camera such that each sub-region is exposed in between the camera's image sensor read-out, and may be subsequently assembled to provide continuous video data at a framerate that is higher than the camera image sensor read-out rate. The resultant framerate and time resolution of the compiled video data are equal to the camera read-out rate multiplied by the number of sub-frames collected within the full-frame image. For example, an image sensor or detector which is subdivided into an 8×8 array of sub-frames by means of the fast, two-dimensional deflector yields video data comprising a 64× improvement in framerate and time resolution.

In the case of high dynamic range data acquisition, the fast switching and the adjustable dwell times for deflecting electrons or photons to each of the detector sub-regions within, e.g., a CMOS camera, provides for acquisition of a series of image data sets within each cycle of the CMOS image sensor read-out that may subsequently be processed to create one or more image frames having much higher dynamic range than is possible with single full-frame data capture. In some instances, for example, a single detector divided into 16 exposure regions could be used to acquire images under sixteen different exposure conditions, such that the detector readout is processed to yield a single HDR image. In some instances, a single detector divided into 16 exposure regions could be used to acquire four images under each of four different exposure conditions, such that the detector readout is processed to yield four HDR images. In some instances, the data acquired during each detector array read-out cycle may be processed to yield 1, 2, 4, 8, 16, 32, 64, 128, or more HDR images.

In some instances, high dynamic range data acquisition may be provided by using an array of individual detectors, e.g., an array of CMOS image sensors, where the sensitivity and/or saturation level for the individual detectors may be adjusted for each detector instead of, or in addition to, adjusting the dwell time for deflection of electrons or photons to each individual detector. In some instances, the disclosed methods and systems may comprise the use of a fast electrostatic deflector which can direct scattered and transmitted electrons sequentially to different sub-regions of a detector, or to each of a series of detectors. In some instance, a deflector control system causes each detector to be exposed for a different length of time, and a processor or computer collects and analyzes data from the sub-regions or series of detectors. In some instances, the deflector control system is integrated with the timing for reading out the detectors and/or modulating operational parameters of the electron microscope, such as the location or angle of the probe beam on the sample. The analysis method performed by the processor or computer forms composite images from the data acquired during the different sub-region or detector readouts which represent different exposure times and/or sensitivity levels. The resulting composite image(s) thus may have a substantially larger dynamic range than the individual images read-out from the individual sub-regions or detectors.

In some instances, the disclosed systems may be configured for simultaneous acquisition of high-framerate and high dynamic range video data comprising image data or diffraction data. Although discussed primarily in the context of electron microscopy, the disclosed methods and systems may also be applied to optical imaging if a suitable fast, two-dimensional deflector for photons, e.g., a rotating mirror or prism, is substituted for the two-dimensional deflector used for deflecting electrons. Various aspects of the disclosed methods and systems described herein may be applied to any of the particular electron or photon microscopy applications set forth below, or for other types of image, diffraction pattern, or spectral data acquisition applications. It shall be understood that different aspects of the disclosed methods and systems can be appreciated individually, collectively, or in combination with each other.

Definitions: Unless otherwise defined, all of the technical terms used herein have the same meaning as commonly understood by one of ordinary skill in the art in the field to which this disclosure belongs.

As used in this specification and the appended claims, the singular forms "a", "an", and "the" include plural references unless the context clearly dictates otherwise. Any reference to "or" herein is intended to encompass "and/or" unless otherwise stated.

As used herein, the term 'about' a number refers to that number plus or minus 10% of that number. The term 'about' when used in the context of a range refers to that range minus 10% of its lowest value and plus 10% of its greatest value.

As used herein, the term "two-dimensional detector array" may in some instances refer to a single detector, e.g., a CCD or CMOS image sensor, comprising a two dimensional array of individual pixels or groupings of pixels, or in some instances may refer to a two dimensional array of individual detectors, e.g., a two-dimensional array of CCD or CMOS image sensors. In some instances, a two-dimensional detector array may comprise a two dimensional array of individual detectors that include a combination of CMOS image sensors, CCD image sensors, dark-field STEM detectors, Faraday cup sensors, or other types of detectors, as will be discussed in more detail below.

As used herein, the term "video" may in some instances may refer to image or diffraction pattern data organized as a function of time. In some instances, the term "video" may refer to image or diffraction data organized as a function of a different measurement operational parameter, e.g., electron probe beam position, or as a function of a multidimensional vector of measurement operational parameters to map the data onto higher dimensional data structures. In any of these instances, the data may be referred to as "high framerate data".

As used herein, the phrase "continuous synchronization" refers to the precise synchronization of two processes (e.g., the deflection of a two-dimensional deflector with a rolling shutter read-out from a CMOS camera) over a prolonged period of time (e.g., a data acquisition period of up to 8 hours, or more) such that the timing accuracy for the two processes meets a defined performance specification (e.g., where the synchronization of the two processes is accurate to within 50 msec, or better), as will be discussed in more detail below.

High framerate electron microscopy: In transmission electron microscopy (TEM), high-speed video is an increasingly important tool to characterize the dynamics of biological samples and nanoscale materials. When synchronized to the modulation of experimental parameters such as sample tilt or probe beam position, high-speed video enables high-throughput acquisition of large multi-dimensional datasets which are useful in scientific and industrial applications.

The electrons used in the TEM imaging process can easily damage the sample being measured. The ideal detection process would utilize a 100% duty cycle for image capture to avoid unnecessary or unmeasured exposure of the sample. This makes global shutter operation undesirable, since electrons continue to impinge on the sample during all or a portion of the read-out cycle, and are discarded rather than detected. By directing electrons that have been transmitted or scattered by the sample (e.g., the patterns of transmitted or scattered electrons that comprise image or diffraction data) away from the regions of the camera that are actively being read out in rolling shutter mode and towards those regions that are available for exposure, the methods and system disclosed herein avoid wasting electrons by ensuring that all electrons that impinge on the sample have an opportunity to contribute to the measurement.

In addition to damaging the sample under measurement, electron beams in TEMs may easily damage conventional image detectors. Therefore the image detectors used in TEMs must be specifically radiation-hardened or specially designed for use with electron beams, leading to significant tradeoffs in durability, spatial resolution, dynamic range, and speed. As noted above, there is a need for improved methods to capture high framerate TEM video data. The methods and systems disclosed herein can be used to enhance the performance of most TEM image sensors on the market today, as well as detectors currently under development.

There are a number of applications in TEM imaging where a reduced number of pixels per video frame is an acceptable trade-off in exchange for enhanced framerate. Most TEM image sensors on the market today offer the ability to read out reduced fields-of-view, or to bin pixels together resulting in a loss of spatial resolution, in exchange for higher speeds. The disclosed methods and systems provide more flexibility for users to make similar tradeoffs over a broader range of parameters to attain a substantially higher framerate.

Prior art disclosures in both photon and electron optics have utilized two-dimensional electrostatic deflectors to subdivide an image sensor for the purpose of recording a burst of images or a streak image. See, for example, U.S. Pat. Nos. 3,887,841 and 4,565,923 (describing a CCD framing camera technique) and U.S. Pat. No. 9,451,177 B2 (describing a high speed camera in which light is converted to electrons, which are deflected to a series of phosphor blocks and converted back to light for the capture of a sequence of image frames). In the case of electron optics, a two-dimensional electrostatic deflector has been used to capture multiple sub-frames of stroboscopically-illuminated images within single camera readouts, as described in U.S. Pat. No. 9,165,743 B2. To our knowledge, none of these references have described the continuous synchronization of a fast, two-dimensional electrostatic or electromagnetic deflector with a rolling-shutter video image sensor to achieve continuous, high-framerate video data acquisition of arbitrary length, which is a key advantage of the presently disclosed methods.

A somewhat related technique for performing spectroscopic measurements in electron microscopes is described in WO 2019/028129 A1. In this publication, a CMOS sensor designed to capture electron images is used to record electron energy loss spectra (EELS). A spectrum is projected onto the camera in a long thin stripe. A one-dimensional electrostatic deflector scrolls the spectrum exposure stripe across the camera as a function of time, such that it avoids exposing any area of the image sensor that is actively being read out. This is intended to enable EELS spectral data acquisition at higher throughput. The method described in the WO 2019/028129 A1 reference is distinct from that disclosed herein in at least three ways: (i) the method disclosed herein enables enhanced acquisition of video data at high framerates for real-space image and diffraction data, whereas the method of WO 2019/028129 A1 is applied to EELS spectra, (ii) the method disclosed herein uses a two-dimensional deflector to arrange video frames in a grid-like pattern on the two-dimensional sensor, whereas the method of WO 2019/028129 A1 only shifts the spectrum exposure stripe in one dimension, and (iii) the method disclosed herein applies to a broader definition of 'sensor'. The method disclosed in the WO 2019/028129 A1 reference specifies the use of a CMOS electron image detector, whereas the methods disclosed herein may apply to deflecting a pattern of transmitted or scattered electrons to different regions of a single image detector, or between elements in an array of different detectors where, e.g., in the case of high dynamic range data acquisition as will be discussed in more detail below, the different detectors may have different sensitivity levels or detection capabilities.

As noted above, the disclosed methods and systems enhance video frame rate data acquisition in an electron microscope (or in optical systems as will be discussed in more detail below) by continuously sequencing the exposure of different detectors, or different sub-regions of a single detector, such that there is no loss of signal during readout. This is accomplished using a fast two-dimensional deflector, e.g., a 2D electrostatic deflector or a 2D electromagnetic deflector, for which the switching time is much faster than the dwell times used to expose each sub-region of the detector, to direct a pattern of electrons transmitted or scattered by a sample (e.g., image data or diffraction data) to different sub-regions of the detector as illustrated in FIG. 1. FIG. 1 shows a non-limiting example of a TEM in which an electron beam originating from an electron gun or other source positioned at the top of the instrument propagates downward through a sample. Electron optics (not shown) image the beam transmitted or scattered by the sample onto a detector positioned at the bottom of the instrument. Between the sample and detector (as configured in a standard TEM), is a 2D deflector device which applies an electric field to shift or deflect the transmitted or scattered electrons (e.g., the image or diffraction pattern) to a programmed sub-region of the detector. Electronic hardware and automation software are used to control the programmed sequence of sub-region exposure and maintain precise, continuous synchronization between the deflection sequence and the camera's readout rate (e.g., by modulating a deflector control signal). Although FIG. 1 depicts both the "STEM scan control" and the "detector synchronization" modules as being directly connected to the "subframe sequence control" module, the interconnection of these timing systems may be configured differently in other implementations. The "detector synchronization" module could be directly connected to the "STEM scan control" module, for example. In the example depicted in FIG. 1, the camera is subdivided into 16 exposure sub-frames. If the detector is a single standard TEM camera, continuous video with a 16× enhancement in framerate is achieved.

Figure 2:
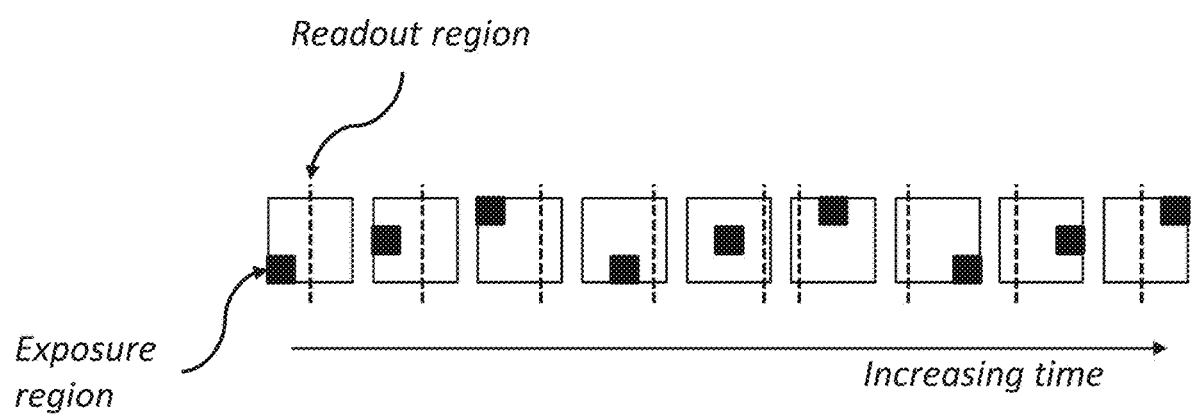
FIG. 2 provides an illustration of one non-limiting example of an exposure sequence for deflecting electrons (or in some instances, photons) to different sub-regions of a two-dimensional detector.

FIG. 2 provides a non-limiting example of an exposure sequence which divides the detector into nine distinct sub-regions. The square outline represents the full detector area at a given point in time. The dashed line represents the pixels being read at the same point in time. In a rolling-shutter readout mode, the readout line moves continuously across the camera and returns immediately to the first line after the final line is read out. The small black squares show the exposed region at the same point in time. The timing of the deflectors and the camera are carefully synchronized such that the exposed regions never coincide with the readout regions.

Figure 3:
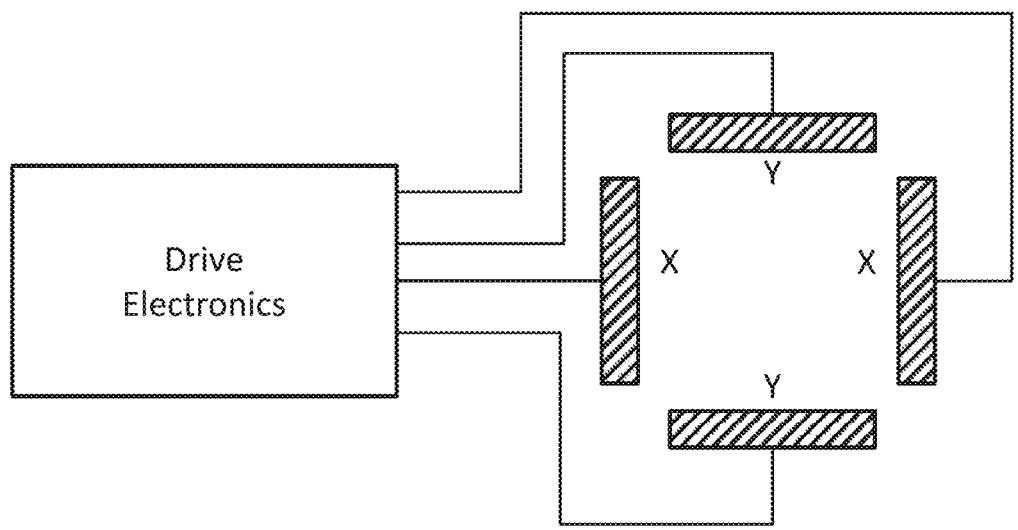
FIG. 3 provides a schematic illustration of a two-dimensional electrostatic deflector.

FIG. 3 provides a schematic illustration of a two-dimensional electrostatic deflector comprising two pairs of electrodes (X electrodes and Y electrodes) which may be used in implementing the disclosed methods and systems. FIGS. 4A-4E provide a non-limiting example of a timing diagrams for synchronizing the electrostatic deflection of electrons in a TEM to expose different sub-regions of a two-dimensional detector, such as a CMOS camera, with a rolling shutter read-out signal for the two-dimensional detector. In this illustration, the read-out of the CMOS camera sensor is depicted for rows of pixels in three regions A, B, and C (FIG. 4A) in the timing diagram at the upper right (FIG. 4B). Read-out of the image sensor proceeds row-by-row across the detector in one dimension and then reverts to the first row. In this example, the two-dimensional deflector deflects electrons into a grid of 3×3=9 sub-frames or exposure regions (FIG. 4C) according to the sequence of exposures depicted in the timing diagram in FIG. 4D, thereby resulting in a 9× enhancement in video framerate. The sequence of voltages applied between two pairs of electrodes (i.e., the X and Y electrodes in the two-dimensional electrostatic deflector illustrated in FIG. 3) that are used to implement the deflection pattern and timing shown in FIGS. 4C and 4D are depicted in FIG. 4E. As noted above, the enhancement in framerate is determined by the total number of sub-regions (or individual detectors) included in the exposure sequence for the detector (or two dimensional detector array). For example, in the instance that a sequence of 4 exposures, e.g., corresponding to a 2×2 array of sub-regions or individual detectors, is used, the resulting data acquisition framerate may be 4× that of the read-out rate for the individual detector (or two-dimensional array of detectors). In some instances, the video data framerate achieved using the disclosed methods and systems may be at least 4×, at least 8×, at least 12×, at least 16×, at least 20×, at least 24×, at least 28×, at least 32×, at least 64×, at least 128×, at least 256×, at least 512×, or higher. In some instances, the data acquisition framerate achieved using the disclosed methods and systems may be any value within this range, e.g., at least 144×.

Although FIG. 4C illustrates the use of a two-dimensional deflector to deflect electrons into a grid of 3×3=9 sub-frames or exposure regions, in some instances, other patterns of exposure may be used. In some instances, the two-dimensional deflector may be used to deflect electrons to, for example, a pattern of 2×2, 3×3, 4×4, 5×5, 6×6, 7×7, 8×8, 9×9, 10×10, 11×11, 12×12, 13×13, 14×14, 15×15, 16×16, 17×17, 18×18, 19×19, 20×20 sub-regions, or more. In some instances, the two-dimensional deflector may be used to deflect electrons to non-square arrays of sub-regions, such as 3×4, 6×9, 9×12, 12×15, and so on. In some instances, the two-dimensional deflector may be used to deflect electrons to, for example, a pattern of 2×2, 3×3, 4×4, 5×5, 6×6, 7×7, 8×8, 9×9, 10×10, 11×11, 12×12, 13×13, 14×14, 15×15, 16×16, 17×17, 18×18, 19×19, 20×20, or more different detectors in the two-dimensional detector array. In some instances, the two-dimensional deflector may be used to deflect electrons to non-square arrays of individual detectors, such as 3×4, 6×9, 9×12, 12×15 detectors, and so on.

In FIG. 4C, the sub-frames or sub-regions (i.e., the exposure regions) are shown as adjacent rectangular regions. In some instances, they may be non-rectangular and/or non-adjacent. In some instances, the deflected beam may be projected through a circular aperture thereby resulting in projecting an array of circular images on the camera (see, for example, FIG. 1). In some instances, there may be gaps between the exposure regions consisting of pixels that are never exposed during a sequence. In some instances, there may be overlaps between the exposure regions, such that certain pixels are exposed multiple times before they are read out.

In FIGS. 4C and 4D, the order of exposing the different sub-frames/sub-regions of the camera (FIG. 4C (spatial map) and FIG. 4D (exposure timing diagram)) is shown in reading order (see FIG. 4A (spatial map) and FIG. 4B (read-out timing diagram)), however the actual order may be any pattern that avoids exposing the specific region of the camera which is actively being read out. For example, in some instances a sinusoidal pattern may be used to achieve minimum switching times. In some instances, the order of exposures within each row of sub-regions might be shuffled. In some instances, the sub-frame exposure sequence may or may not be the same for each camera readout cycle. In some instances, each sub-frame may be exposed exactly once for a given camera readout cycle. In other instances, certain sub-frames may be exposed multiple times. Such an exposure sequence may or may not be used in implementing a compressive sensing data acquisition mode. In some instances, certain sub-frames may be skipped to create a fiducial mark in time to facilitate interpretation of the data.

The voltage waveforms applied to each pair of deflector electrodes (X and Y pairs) are shown in FIG. 4E as comprising step changes of equal magnitude. In some instances, one plate of each pair may be held at a fixed voltage, or the voltages applied to each pair may differ in magnitude or have the same or opposite sign. In some instances, the magnitude of the voltage waveforms may range from about 0 volts to about 10 kV. In some instances, the magnitude of the voltage waveforms may be at least 0 volts, at least 10 volts, at least 100 volts, at least 500 volts, at least 1,000 volts, at least 5 kV, or at least 10 kV. In some instances, the magnitude of the voltage waveforms may be at most 10 kV, at most 5 kV, at most 1,000 volts, at most 500 volts, at most 100 volts, at most 10 volts, or about 0 volts. Any of the lower and upper values described in this paragraph may be combined to form a range included within the present disclosure, for example, in some instances the magnitude of the voltage waveform may range from about 100 volts to about 1,000 volts. In some instances, the magnitude of the voltage waveform may have any value within this range, e.g., about 665 volts. The magnitudes and timing sequences for the voltage waveforms are programmable, and comprise the sequence of four electrode voltages that determine the number of exposure regions, the order in which sub-regions are exposed, and the duration of the exposure at each sub-region (i.e., the dwell time for each sub-region).

The deflection of the transmitted or scattered electrons between sub-frames/exposure regions may be accomplished in the system illustrated in FIG. 3 and FIGS. 4A-4E using a sequence of voltages on pairs of electrodes that apply an electric field to a beam of electrons. In other implementations, the electrons may be deflected by, e.g., using magnetic fields generated by a sequence of electrical currents driven through magnetic coils. In yet other implementations, there may be additional electrodes or electromagnets to which voltages or currents are applied, such that image or diffraction data distortions introduced by the deflection process are reduced.

In some instance, the duration of the exposure at each sub-region or individual detector within the two-dimensional detector array (i.e., the dwell time for each sub-region or individual detector) may range from about 1 μsec to about 100 msec. In some instances, the dwell time may be at least 1 μsec, at least 10 μsec, at least 100 μsec, at least 1 msec, at least 10 msec, or at least 100 msec. In some instances, the dwell time may be at most 100 msec, at most 10 msec, at most 1 msec, at most 100 μsec, at most 10 μsec, or at most 1 μsec. Any of the lower and upper values described in this paragraph may be combined to form a range included within the present disclosure, for example, in some instances the dwell time may range from about 10 μsec to about 10 msec. In some instances, the dwell time may have any value within this range, e.g., about 1.3 msec. In some instances, as illustrated in the timing diagram of FIG. 4D, the dwell times for each sub-frame/exposure region/individual detector may be equal to one another. In some instances, the dwell times for each sub-frame/exposure region/individual detector may be different from one another and may be individually adjustable.

In some instances, the methods and systems described herein are configured to provide for high duty cycle operation without incurring temporal distortion of the data. In some instances, the duty cycle may be at least 85%, at least 90%, at least 95%, at least 98%, or at least 99% without incurring temporal distortion of the data.

In general, the switching speed of the two-dimensional deflector should be fast compared to the dwell times used for exposure of sub-regions or individual detectors in order to minimize temporal distortions, i.e., so that there is no blurring between frames. In some instances, the switching time of the two-dimensional deflector may range from about 1 nsec to about 1 msec. In some instances, the switching time is at least 1 nsec, at least 10 nsec, at least 100 nsec, at least 1 μsec, at least 10 μsec, at least 100 μsec, or at least 1 msec. In some instances, the switching time is at most 1 msec, at most 100 μsec, at most 10 μsec, at most 1 μsec, at most 100 nsec, at most 10 nsec, or at most 1 nsec. Any of the lower and upper values described in this paragraph may be combined to form a range included within the present disclosure, for example, in some instances the switching time may range from about 10 nsec to about 10 μsec. In some instances, the switching time may have any value within this range, e.g., about 1.3 msec. In some instances, the switching times for switching between sub-frames/exposure regions/individual detectors may be equal to one another. In some instances, the switching times may be different, and may be individually adjustable.

In general, the spatial positioning achieved by the two-dimensional deflector should be sufficiently accurate that the jitter in re-positioning a deflected image or diffraction pattern is less than about the dimensions of a single image sensor pixel. In some instances, the spatial positioning achieved by the two-dimensional deflector is accurate to better than about 500 µm, better than about 450 µm, better than about 400 µm, better than about 350 µm, better than about 300 µm, better than about 250 µm, better than about 200 µm, better than about 150 µm, better than about 100 µm, better than about 90 µm, better than about 80 µm, better than about 70 µm, better than about 60 µm, better than about 50 µm, better than about 40 µm, better than about 30 µm, better than about 20 µm, better than about 10 µm, better than about 9 µm, better than about 8 µm, better than about 7 µm, better than about 6 µm, better than about 5 µm, better than about 4 µm, better than about 3 µm, better than about 2 µm, or better than about 1 µm.

In some instances, the synchronization of the two-dimensional deflector with the read-out cycle of the detector (e.g., a rolling shutter read-out cycle for a CMOS camera) may be accurate to better than 50 msec, better than, 40 msec, better than 30 msec, better than 20 msec, better than 10 msec, better than 9 msec, better than 8 msec, better than 7 msec, better than 6 msec, better than 5 msec, better than 4 msec, better than 3 msec, better than 2 msec, better than 1 msec, better than 900 µsec, better than 800 µsec, better than 700 µsec, better than 600 µsec, better than 500 µsec, better than 400 µsec, better than 300 µsec, better than 200 µsec, better than 100 µsec, better than 90 µsec, better than 80 µsec, better than 70 µsec, better than 60 µsec, better than 50 µsec, better than 40 µsec, better than 30 µsec, better than 20 µsec, better than 10 µsec, better than 9 µsec, better than 8 µsec, better than 7 µsec, better than 6 µsec, better than 5 µsec, better than 4 µsec, better than 3 µsec, better than 2 µsec, better than 1 µsec, better than 900 nsec, better than 800 nsec, better than 700 nsec, better than 600 nsec, better than 500 nsec, better than 400 nsec, better than 300 nsec, better than 200 nsec, or better than 100 nsec.

FIGS. 4A and 4B illustrate a typical rolling-shutter read-out pattern where the top row of pixels is read out, then the second row, then the third row, and so forth down to the bottom row. However the disclosed methods apply to any continuous video readout that is performed on different regions of the camera (or different detectors within an array of detectors) at different times. For example, the readout could begin with the left column of pixels and sweep across the camera to the right column of pixels. The readout could encompass multiple simultaneous rows or columns of pixels. The readout could be applied to a sequence of block regions of the camera's image sensor. The key is that exposure is directed in a synchronized fashion to different regions of the camera/detector while they are not being read out, such that continuous readout speeds are achieved without the distortions associated with exposing a region during readout.

In some instances, the disclosed methods (and systems configured to implement them) may include processor- or computer-implemented algorithms and methods to process the acquired data and generate high framerate video data, hyperspectral image data, two-dimensional or N-dimensional arrays of image and/or diffraction pattern data, etc. For example, in some instances the processor- or computer-implemented algorithms and methods may: (i) segment the raw camera read-out data into sub-frames containing individual diffraction patterns or images, (ii) correct for distortions introduced by the deflection process, and (iii) align the sub-frames in order to assemble an image stack, an array of diffraction patterns, or video data which can then be directly viewed or quantitatively analyzed according the same methods which would have been used on slower data from the same detector in a standard operating mode. In some instances, these processing steps may utilize pre-processed calibration data from the same sample as that for which the image data or diffraction data has been acquired. In some instances, these processing steps may utilize pre-processed calibration data for a different sample measured under similar conditions. In some instances, the processor- or computer-implemented algorithms and methods may perform additional processing steps such as: (i) fine-tuning the alignment of sub-frames by identifying consistent features within the sub-frame data itself, (ii) using the fine-tuning of sub-frame alignment to correct for sample drift during the measurement, (iii) filtering to remove noise using prior knowledge of the sample or physical system under measurement, the characteristics of the detector, and/or the optics themselves, and/or (iv) inferring data from regions of the detector array which have been exposed multiple times during a single readout cycle.

In some instances, the continuous, high framerate data compiled using the disclosed methods and systems may comprise from about 2 to about 4,194,304 (e.g., 2048×2048) frames of image or diffraction data. In some instances, the continuous, high framerate video data compiled using the disclosed methods and systems may comprise at least 2, at least 4, at least 8, at least 16, at least 32, at least 64, at least 128, at least 256, at least 512, at least 1,024, at least 2,048, at least 4,096, at least 8,192, at least 16,384, at least 32,768, at least 65,536, at least 131,072, at least 262,144, at least 524,288, at least 1,048,576, at least 2,097,152, or at least 4,194,304 frames of image or diffraction data. In some instances, the number of frames of continuous, high framerate video data compiled using the disclosed methods and systems may have any value within this range, e.g., about 6,200 frames of image or diffraction data. In some instances, the total time required to acquire the data may range from about 1 second to about 8 hours depending on the type of sample and/or measurements being undertaken. In some instances, the total data acquisition time may be at least 1 second, at least 10 seconds, at least 30 seconds, at least 1 minute, at least 10 minutes, at least 30 minutes, at least 1 hour, at least 2 hours, at least 3 hours, at least 4 hours, at least 5 hours, at least 6 hours, at least 7 hours, or at least 8 hours.

High Framerate Optical Microscopy and Imaging:

Although described primarily in the context of data capture for high framerate transmission electron microscopy, the methods described above may also be applied to optical microscopy and imaging applications. For example, a fast, two-dimensional deflector suitable for deflection of photons rather than electrons may be used to deflect patterns of photons that have been transmitted, reflected, and/or scattered by a sample or object to a series of two or more sub-regions of a two-dimensional detector (e.g., a CCD or CMOS image sensor) or a two-dimensional array of individual detectors. Examples of suitable two-dimensional deflectors for deflecting photons include, but are not limited to, rotating mirrors, rotating prisms, etc. CCD or CMOS cameras or other detectors that have been designed and optimized for use with ultraviolet, visible, or infrared light would be chosen rather than those designed and optimized for detection of electrons.

As for the high framerate transmission electron microscopy methods described above, precise and continuous synchronization of a two-dimensional deflector modulation control signal with a continuous read-out mode of the two-dimensional detector, e.g., a rolling shutter mode for a CMOS camera, enables the exposure of a series of two or more sub-regions of the detector that are not actively being read out at the time of exposure. Processing of the image frames acquired by each of the sub-regions may then be used be used to assemble continuous video data having a framerate that is significantly higher than the read-out rate for the two-dimensional detector.

Again, the enhancement in framerate achieved is determined by the total number of sub-regions (or individual detectors) included within the exposure sequence/read-out cycle for the detector (or two dimensional detector array). For example, in the instance that a sequence of 4 exposures, e.g., corresponding to a 2×2 array of sub-regions or individual detectors, is used, the resulting data acquisition framerate may be 4× that of the read-out rate for the individual detector (or two-dimensional array of detectors). In some instances, the video data framerate achieved using the disclosed methods and systems may be at least 4×, at least 8×, at least 12×, at least 16×, at least 20×, at least 24×, at least 28×, at least 32×, at least 64×, at least 128×, at least 256×, at least 512×, or higher. In some instances, the data acquisition framerate achieved using the disclosed methods and systems may be any value within this range, e.g., at least 144×.

In some instances, the two-dimensional deflector may be used to deflect photons to, for example, a pattern of 2×2, 3×3, 4×4, 5×5, 6×6, 7×7, 8×8, 9×9, 10×10, 11×11, 12×12, 13×13, 14×14, 15×15, 16×16, 17×17, 18×18, 19×19, 20×20 sub-regions, or more. In some instances, the two-dimensional deflector may be used to deflect photons to non-square arrays of sub-regions, such as 3×4, 6×9, 9×12, 12×15, and so on. In some instances, the two-dimensional deflector may be used to deflect photons to, for example, a pattern of 2×2, 3×3, 4×4, 5×5, 6×6, 7×7, 8×8, 9×9, 10×10, 11×11, 12×12, 13×13, 14×14, 15×15, 16×16, 17×17, 18×18, 19×19, 20×20, or more different detectors in the two-dimensional detector array. In some instances, the two-dimensional deflector may be used to deflect photons to non-square arrays of individual detectors, such as 3×4, 6×9, 9×12, 12×15 detectors, and so on.

In some instances, the sub-frames or sub-regions (i.e., the exposure regions) may be, e.g., adjacent rectangular regions. In some instances, they may be non-rectangular and/or non-adjacent. In some instances, the deflected beam may be projected through a circular aperture thereby resulting in projecting an array of circular images on the camera. In some instances, there may be gaps between the exposure regions consisting of pixels that are never exposed during a sequence. In some instances, there may be overlaps between the exposure regions, such that certain pixels are exposed multiple times before they are read out.

In some instances, the order of exposing the different sub-frames/sub-regions of the camera may be any pattern that avoids exposing the specific region of the camera which is actively being read out. For example, in some instances a sinusoidal pattern may be used to achieve minimum switching times. In some instances, the order of exposures within each row of sub-regions might be shuffled. In some instances, the sub-frame exposure sequence may or may not be the same for each camera readout cycle. In some instances, each sub-frame may be exposed exactly once for a given camera readout cycle. In other instances, certain sub-frames may be exposed multiple times. Such an exposure sequence may or may not be used in implementing a compressive sensing data acquisition mode. In some instances, certain sub-frames may be skipped to create a fiducial mark in time to facilitate interpretation of the data.

In some instance, the duration of the exposure at each sub-region or individual detector within the two-dimensional detector array (i.e., the dwell time for each sub-region or individual detector) may range from about 1 μsec to about 100 msec. In some instances, the dwell time may be at least 1 μsec, at least 10 μsec, at least 100 μsec, at least 1 msec, at least 10 msec, or at least 100 msec. In some instances, the dwell time may be at most 100 msec, at most 10 msec, at most 1 msec, at most 100 μsec, at most 10 μsec, or at most 1 μsec. Any of the lower and upper values described in this paragraph may be combined to form a range included within the present disclosure, for example, in some instances the dwell time may range from about 10 μsec to about 10 msec. In some instances, the dwell time may have any value within this range, e.g., about 1.3 msec. In some instances, the dwell times for each sub-frame/exposure region/individual detector may be equal to one another. In some instances, the dwell times for each sub-frame/exposure region/individual detector may be different from one another and may be individually adjustable.

In some instances, the methods and systems described herein are configured to provide for high duty cycle operation without incurring temporal distortion of the data. In some instances, the duty cycle may be at least 85%, at least 90%, at least 95%, at least 98%, or at least 99% without incurring temporal distortion of the data.

In general, the switching speed of the two-dimensional deflector should be fast compared to the dwell times used for exposure of sub-regions or individual detectors in order to minimize temporal distortions, i.e., so that there is no blurring between frames. In some instances, the switching time of the two-dimensional deflector may range from about 1 nsec to about 1 msec. In some instances, the switching time is at least 1 nsec, at least 10 nsec, at least 100 nsec, at least 1 μsec, at least 10 μsec, at least 100 μsec, or at least 1 msec. In some instances, the switching time is at most 1 msec, at most 100 μsec, at most 10 μsec, at most 1 μsec, at most 100 nsec, at most 10 nsec, or at most 1 nsec. Any of the lower and upper values described in this paragraph may be combined to form a range included within the present disclosure, for example, in some instances the switching time may range from about 10 nsec to about 10 μsec. In some instances, the switching time may have any value within this range, e.g., about 1.3 msec. In some instances, the switching times for switching between sub-frames/exposure regions/individual detectors may be equal to one another. In some instances, the switching times may be different, and may be individually adjustable.

As for the electron microscopy case, the spatial positioning achieved by the two-dimensional deflector should be sufficiently accurate that the jitter in re-positioning a deflected image or diffraction pattern is less than about the dimensions of a single image sensor pixel. In some instances, the spatial positioning achieved by the two-dimensional deflector is accurate to better than about 500 μm, better than about 450 μm, better than about 400 μm, better than about 350 μm, better than about 300 μm, better than about 250 μm, better than about 200 μm, better than about 150 μm, better than about 100 μm, better than about 90 μm, better than about 80 μm, better than about 70 μm, better than about 60 μm, better than about 50 μm, better than about 40 μm, better than about 30 μm, better than about 20

μm, better than about 10 μm, better than about 9 μm, better than about 8 μm, better than about 7 μm, better than about 6 μm, better than about 5 μm, better than about 4 μm, better than about 3 μm, better than about 2 μm, or better than about 1 μm.

Again, the synchronization of the two-dimensional deflector with the read-out cycle of the detector (e.g., a rolling shutter read-out cycle for a CMOS camera) may be accurate to better than 50 msec, better than, 40 msec, better than 30 msec, better than 20 msec, better than 10 msec, better than 9 msec, better than 8 msec, better than 7 msec, better than 6 msec, better than 5 msec, better than 4 msec, better than 3 msec, better than 2 msec, better than 1 msec, better than 900 μsec, better than 800 μsec, better than 700 μsec, better than 600 μsec, better than 500 μsec, better than 400 μsec, better than 300 μsec, better than 200 μsec, better than 100 μsec, better than 90 μsec, better than 80 μsec, better than 70 μsec, better than 60 μsec, better than 50 μsec, better than 40 μsec, better than 30 μsec, better than 20 μsec, better than 10 μsec, better than 9 μsec, better than 8 μsec, better than 7 μsec, better than 6 μsec, better than 5 μsec, better than 4 μsec, better than 3 μsec, better than 2 μsec, better than 1 μsec, better than 900 nsec, better than 800 nsec, better than 700 nsec, better than 600 nsec, better than 500 nsec, better than 400 nsec, better than 300 nsec, better than 200 nsec, or better than 100 nsec.

As for the electron microscopy methods and systems discussed above, the disclosed optical methods (and optical systems configured to implement them) may further comprise processor- or computer-implemented algorithms and methods to process the acquired data and generate high framerate data. For example, in some instances the processor- or computer-implemented algorithms and methods may: (i) segment the raw camera read-out data into sub-frames containing individual images, (ii) correct for distortions introduced by the deflection process, and (iii) align the sub-frames in order to assemble an image stack, or video data which can then be directly viewed or quantitatively analyzed according the same methods which would have been used on slower data from the same detector in a standard operating mode. In some instances, these processing steps may utilize pre-processed calibration data from the same sample as that for which the image data has been acquired. In some instances, these processing steps may utilize pre-processed calibration data for a different sample measured under similar conditions. In some instances, the processor- or computer-implemented algorithms and methods may perform additional processing steps such as: (i) fine-tuning the alignment of sub-frames by identifying consistent features within the sub-frame data itself, (ii) using the fine-tuning of sub-frame alignment to correct for sample drift during the measurement, (iii) filtering to remove noise using prior knowledge of the sample or physical system under measurement, the characteristics of the detector, and/or the optics themselves, and/or (iv) inferring data from regions of the detector array which have been exposed multiple times during a single readout cycle.

In some instances, the continuous, high framerate video data compiled using the disclosed methods and systems may comprise from about 2 to about 4,194,304 (e.g., 2048×2048) frames of image data or diffraction data. In some instances, the continuous, high framerate video data compiled using the disclosed methods and systems may comprise at least 2, at least 4, at least 8, at least 16, at least 32, at least 64, at least 128, at least 256, at least 512, at least 1,024, at least 2,048, at least 4,096, at least 8,192, at least 16,384, at least 32,768, at least 65,536, at least 131,072, at least 262,144, at least 524,288, at least 1,048,576, at least 2,097,152, or at least 4,194,304 frames of image or diffraction data. In some instances, the number of frames of continuous, high framerate video data compiled using the disclosed methods and systems may have any value within this range, e.g., about 6,200 frames of image or diffraction data. In some instances, the total time required to acquire the data may range from about 1 second to about 8 hours depending on the type of sample and/or measurements being undertaken. In some instances, the total data acquisition time may be at least 1 second, at least 10 seconds, at least 30 seconds, at least 1 minute, at least 10 minutes, at least 30 minutes, at least 1 hour, at least 2 hours, at least 3 hours, at least 4 hours, at least 5 hours, at least 6 hours, at least 7 hours, or at least 8 hours.

In some instances, the disclosed methods for high framerate acquisition of optical image data may be implemented in the context of optical microscopy for imaging cells or other microscopic structures. In some instances, the disclosed methods for high framerate acquisition of optical image data may be implemented in the context of high speed video cameras for imaging moving objects.

Figure 5:
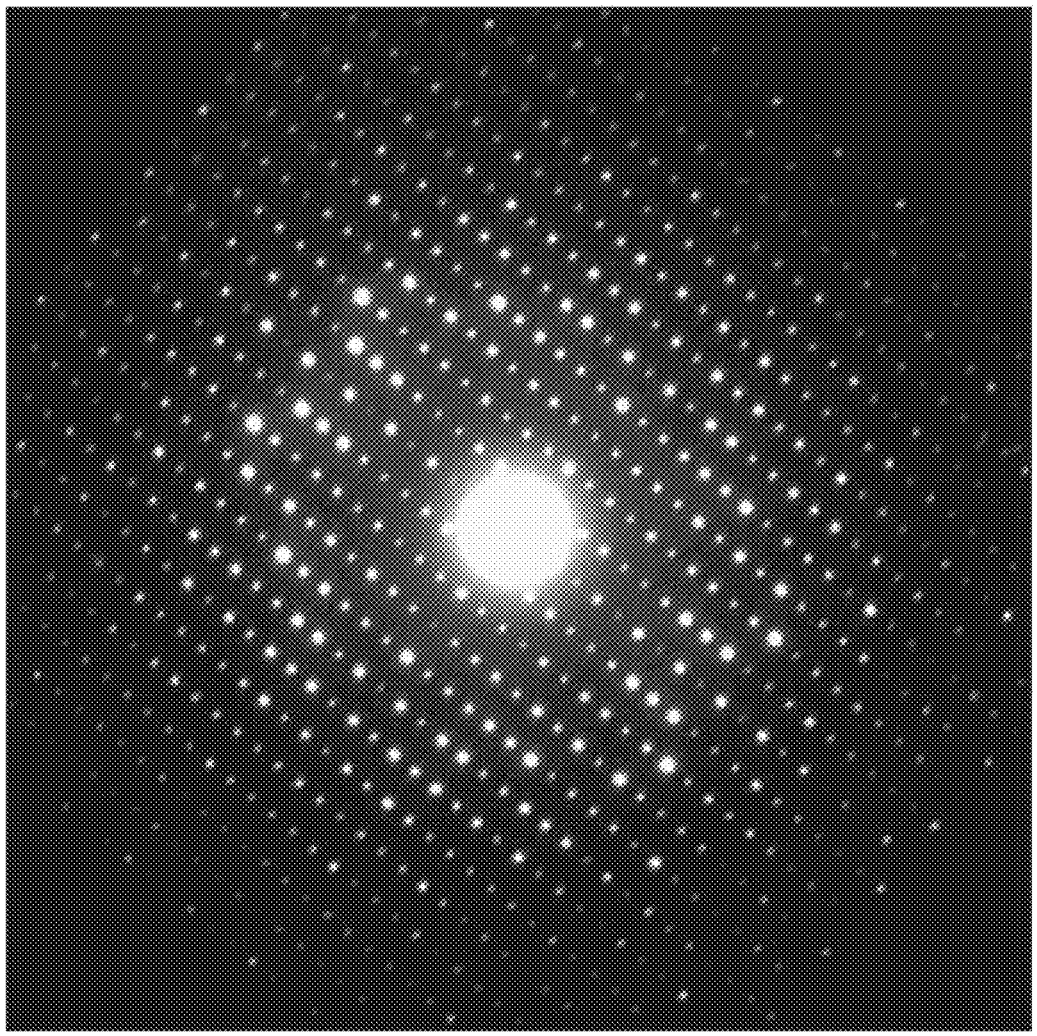
FIG. 5 provides an example of a typical selected area electron diffraction (SAED) electron diffraction pattern showing saturation effects at the central spot.

High Dynamic Range Electron Microscopy:

Measurement of diffraction data using an electron microscope (EM) is an essential tool for the characterization and analysis of materials. Examples include, but are not limited to, Selected Area Electron Diffraction (SAED) Convergent Beam Electron Diffraction (CBED), and Transmission Kikuchi Diffraction (TKD) measurements performed in Transmission Electron Microscopes (TEMs). One of the major challenges for collecting diffraction data is that the data typically exceeds the dynamic range of detectors that are on the market today. This leads to detector saturation effects which can distort or obscure important information (FIG. 5). The ability to more faithfully capture the full dynamic range of diffraction pattern data (or image data) with high throughput and without incurring detector saturation issues, as conferred by the methods described herein constitutes a significant advance over the state of the art.

Other techniques have been used in past attempts to address the problem of limited dynamic range in image-type data, although not all of these techniques have been applied to diffraction data or even to electron microscopy. Selective occlusion has been standard practice for many TEM diffraction data acquisition systems. The approach comprises simply placing an object such as a needle in front of the detector at the predictable location of the bright central spot corresponding to the impact point for un-diffracted electrons (see FIG. 5). This process sacrifices some of the diffraction pattern data to enable measurement of dimmer diffraction spots far from the center. Unfortunately, it is generally not possible to block all of the un-diffracted electrons and eliminate detector saturation completely, and a significant loss of useful information occurs. The methods disclosed herein enable the capture of information from both the dim and the bright spots over the entire image area.

Another prior art method is fast movie/dose fractionation in which video is captured at high framerate, and an arbitrary number of frames are summed to obtain the desired exposure time. The methods disclosed herein use an electrostatic deflector, which enables control of the exposure over a much wider range of values (to date, we have demonstrated exposure times in the range of 1 second down to 50 nanoseconds) whereas camera full-frame exposures are typically 1 msec or longer, even in high-end cameras. Furthermore, the disclosed methods provide for a faster total acquisition time, e.g., in situations where cycle time is limited by detector readout latency, the disclosed systems can expose one detector while another is read out, and data from multiple exposure times can be captured and transferred in the equivalent of a single detector readout period. This speed is important in applications such as 4D STEM, which may be used to acquire an image at many locations on the sample and is typically limited by sensor throughput.

Dual EELs (see WO 2019/028129 A1) is another related technique, although quite distinct from the presently disclosed methods. An electron energy loss spectroscopy (EELS) spectrum is measured in a specialized detector which converts energy information into spatial shifts on a camera. A second shifted copy of the spectrum is taken at a different exposure time on the same detector, and the two copies can be separately analyzed to extract more information from the same measurement. Exposure times for the two copies of the spectrum can be independently varied. Implementation uses a fast one-dimensional electrostatic deflector to direct electrons to different regions of a CCD or CMOS camera. The presently disclosed methods are directed towards enhancing the dynamic range of image and diffraction data acquisition, whereas Dual EELS is a method used for performing electron energy spectroscopy in systems comprising a single detector. Furthermore, the presently disclosed methods allow one to modulate the magnification as well as the position of the image or diffraction data on the camera sensor (or on an array of different sensors), which the dual EELS approach does not.

Direct detection EELS (U.S. Patent Application Publication No. 2017/0207059 A1, hereafter the "'059 patent application") is an approach in which a counting-mode high-speed direct electron detector is integrated into an EELs spectrometer, and a high-speed electrostatic beam blanker controls the exposure time. Multiple detector readouts with different exposure times are processed in sequence to generate a single dataset with optimal dynamic range. Counting mode direct-detection is a new method of imaging electrons which exhibits lower noise in some situations. The approach disclosed in the '059 patent application is aimed at overcoming the shortcomings of counting mode, namely the very low maximum electron dose rate and therefore dynamic range, but differs from the methods disclosed herein. The presently disclosed methods use electrostatic or electromagnetic optics to switch the image or diffraction data to different detectors or different pixel regions within a single detector, whereas the '059 patent application uses electrostatic optics to block electrons from reaching the camera. The presently disclosed methods and systems allow one to gather data with potentially higher duty cycle and reduced dose to the sample.

A method frequently used in image capture by mobile phone cameras and other scientific imaging applications comprises taking two pictures at different exposure times, and post-processing the images to create a single high dynamic range image. Drift in sample alignment and other imaging conditions during measurement make this method less reliable, and its use is being phased out of high-end mobile phone cameras in favor of other techniques, e.g., the Sony Interline HDR approach in which the image sensor comprises alternating rows of pixels that are read out at different exposure levels and stitched together into a single image in post-processing. This approach provides an improvement over the previous mobile phone methods because it allows acquisition of an HDR image using one exposure instead of two. Newer sensors, e.g., the Sony IMX294CJK color SMOS image sensor, have more complex pixel patterns using different simultaneous exposure levels. These approaches differ from the presently disclosed methods and systems in that, in some instances, the presently disclosed methods and systems for enhancing the dynamic range of image and diffraction data acquisition may comprise the use of multiple detectors. Furthermore, the presently disclosed methods and systems allow one to modulate the magnification as well as the position of the image or diffraction data on the camera sensor and/or the probe beam on the sample. The use of a fast, two-dimensional deflector in the presently disclosed methods and systems also affords greater control over exposure times. Finally, there is no data acquired for the same position within the image at multiple exposure levels in the interline HDR approach, so interline HDR relies more heavily on inference which may not be desirable in scientific applications.

In contrast to the methods and systems described herein, none of the prior art methods utilize rapid deflection of electrons transmitted or scattered by a sample between multiple, distinct detectors (or, in some instance, different sub-regions of a single detector) which may be individually adjusted for sensitivity and/or saturation level. The individual image frames captured by the different detectors (or sub-regions of a single detector) may subsequently be processed to create one or more image frames comprising a much higher dynamic range than that achievable with a single image sensor or a single, full frame image sensor read-out. The disclosed methods offer higher dynamic range, increased versatility in terms of detector type, minimal complexity, and more control over exposure levels than prior methods.

In TEM imaging detectors there is a tradeoff between sensitivity and resistance to damage. It can be advantageous in some situations to alternate between an array of detectors which are independently optimized for different measurements and situations. For example, the electron beam could briefly visit a sensor to measure electric current or verify proper alignment during a measurement sequence. Or a relatively long exposure time (i.e., the dwell time of the beam at a given detector or detector sub-region) may be given to a specific region of the camera or detector array which is relatively more resistant to the damage of electron radiation. In applications where experimental parameters are modulated in concert with the video measurement, there can be times where the data temporarily becomes invalid or noisy. To prevent contamination of the broader dataset, image data can be deflected to a detector region which is disabled, or has zero sensitivity during such times. Due to the large variety of potential applications, the sensor or detector used in the disclosed methods and systems may, in some instances, simply be an unmodified, commercial TEM image detector, or in other instances, may be an array of detectors optimized for different performance characteristics or purposes. Diffraction pattern measurements are one of the EM applications which are most limited by dynamic range. However, the disclosed methods are equally applicable to real-space TEM imaging applications as well.

As noted, the presently disclosed methods and systems enhance the dynamic range of measurements in an electron microscope (or in some instances, an optical system, as will be discussed further below) by rapidly deflecting the electron beam so as to expose multiple detectors (or different sub-regions within a single detector) to the deflected electrons for different, precisely-controlled exposure times. In some instances, precise and continuous synchronization of a two-dimensional deflector modulation control signal with a continuous read-out mode of the two-dimensional detector, e.g., a rolling shutter mode for a CMOS camera, enables the exposure of a series of two or more sub-regions of the detector that are not actively being read out at the time of exposure, and further processing of the image frames acquired by each of the sub-regions or individual detectors may then be used to assemble continuous high dynamic range video data having a framerate that is significantly higher than the read-our rate for the CMOS camera or two-dimensional detector array.

In some instances, the detectors in a two-dimensional array of detectors may be identical copies of a particular sensor; or copies of a particular sensor that have been individually modified using filters, masks, or sensitivity level or saturation level adjustments appropriate for different electron exposure levels. As noted, in some instances, the detectors may be sub-regions of a single compound detector, such as a CMOS or CCD camera. In some instances, the detector array may contain a combination of different devices optimized to sense, e.g., images, electron beam current, electron beam alignment, or other diagnostic quantities. Examples of suitable devices include, but are not limited to, CCD cameras, CMOS cameras, dark-field STEM detectors, Faraday cups, quad photodiodes, annular dark field detectors, bright field detectors, universal detectors, or any combination thereof. In some instances, a given detector's sensitivity may be modified in a spatially-varying pattern, for example to block the bright central spot where un-diffracted electrons typically strike a camera in certain diffraction measurements.

In some instances, the HDR systems disclosed herein may be configured to modulate the magnification as well as the position of the deflected electron pattern on the camera and/or probe beam on the sample. In some instances, the magnification of the deflected electron pattern and/or probe beam may be at least 2×, 4×, 8×, 16×, or 32× that of the non-magnified deflected electron pattern or probe beam.

Figure 6:
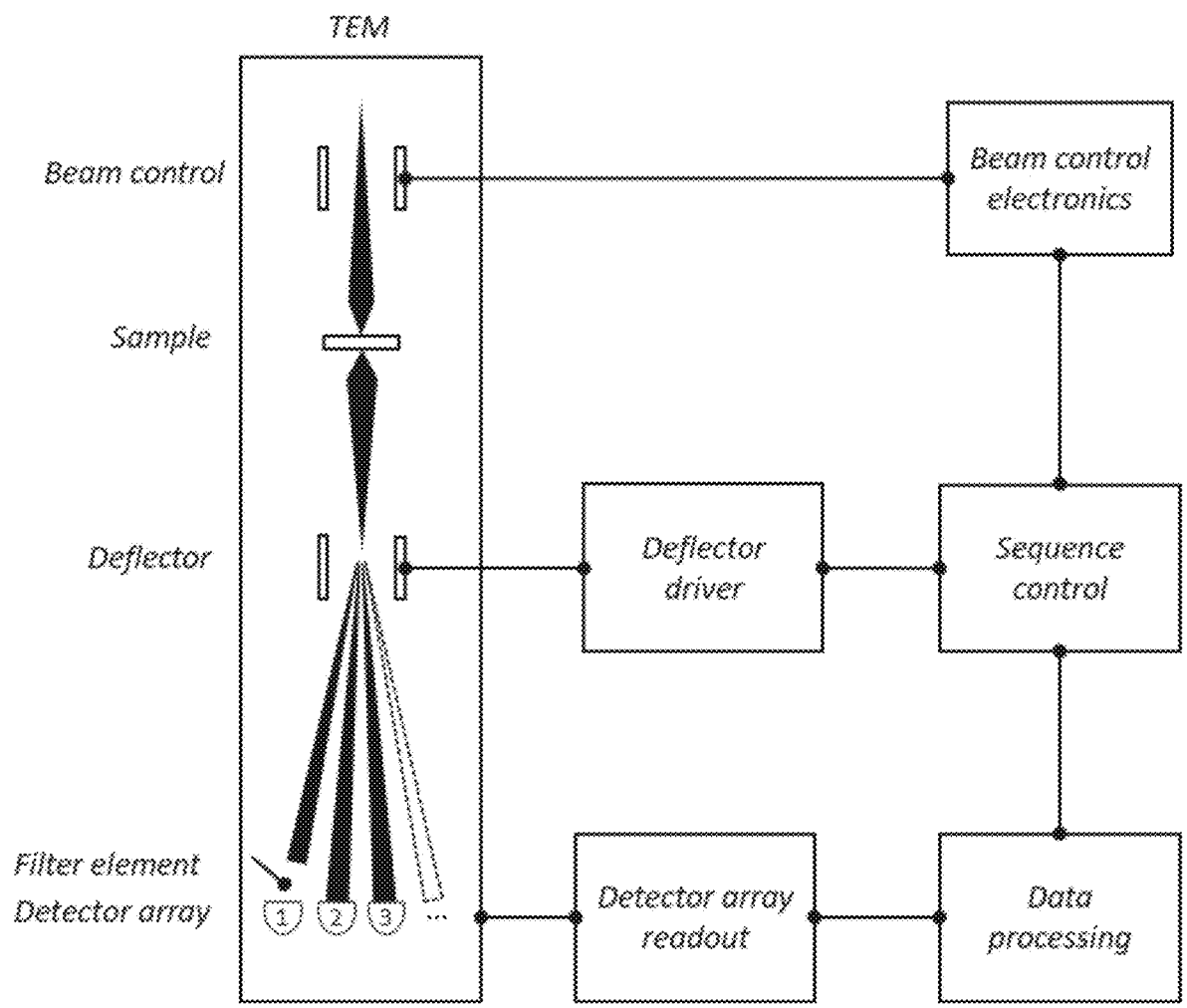
FIG. 6 provides a schematic illustration of a high dynamic range (HDR) transmission electron microscope.

In one non-limiting example of implementation, the exposure may be controlled by a fast electrostatic deflector which is placed in between the sample and detector array, as illustrated in FIG. 6. The deflector applies an electric field to steer the electron beam which contains image data, or the image of the diffraction pattern, onto a specified detector. The deflector may steer the beam in one or two spatial dimensions depending on the layout of the detector array. The dwell time sets the exposure level of each detector. For example, in an array of four detectors, detector 1 could be exposed for 100 nanoseconds, then detector 2 could be exposed for 1 microsecond, then detector 3 could be exposed for 10 microseconds, then detector 4 could be exposed for 100 microseconds. After the exposures are completed, the deflector could steer the beam away from all detectors. In some instances, the deflector may also adjust the magnification of the image to compensate for varying detector heights and positions, or to vary the magnification of the resulting data.

Figure 7:
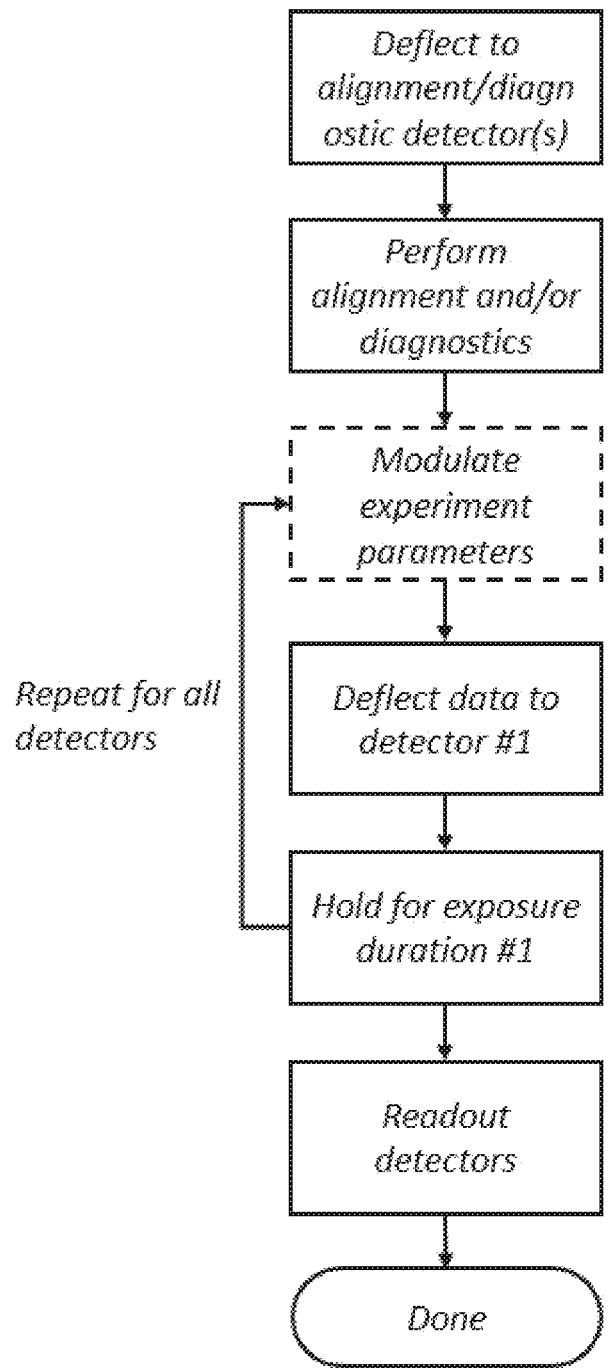
FIG. 7 provides a non-limiting example of a flow chart for HDR data acquisition.

The deflector is synchronized to the read out cycle of the detector array, such that readout does not conflict with exposure. Timing control of other experiment parameters may also be integrated with the deflector system, such as: scan control of the incident beam position on the sample (e.g., in STEM measurements); focus adjustment of the beam on the sample; a pre-sample beam-blanker to control sample exposure; or manipulation of the sample itself. Each detector may be exposed and read out one or more times during a single measurement sequence. A flowchart for the complete measurement process is illustrated in FIG. 7. As indicated in FIG. 7, the measurement process may include the steps of: (i) deflecting the electron beam to one or more detectors used for checking alignment and/or performing other beam diagnostics, (ii) performing alignment steps and/or beam diagnostics, (iii) optionally, modulating one or more experimental parameters that impact the measurement process (e.g., changing the tilt angle of the sample relative to the electron beam), (iv) deflecting the electron beam to one or more detectors or sub-regions of a detector where the dwell time (exposure) may be varied for different detectors or sub-regions, (v) and reading out the one or more detectors or sub-regions of the detector. The process illustrated in FIG. 7 is also applicable to optical implementations of the disclosed HDR methods and systems, as will be discussed further below.

Figure 8:
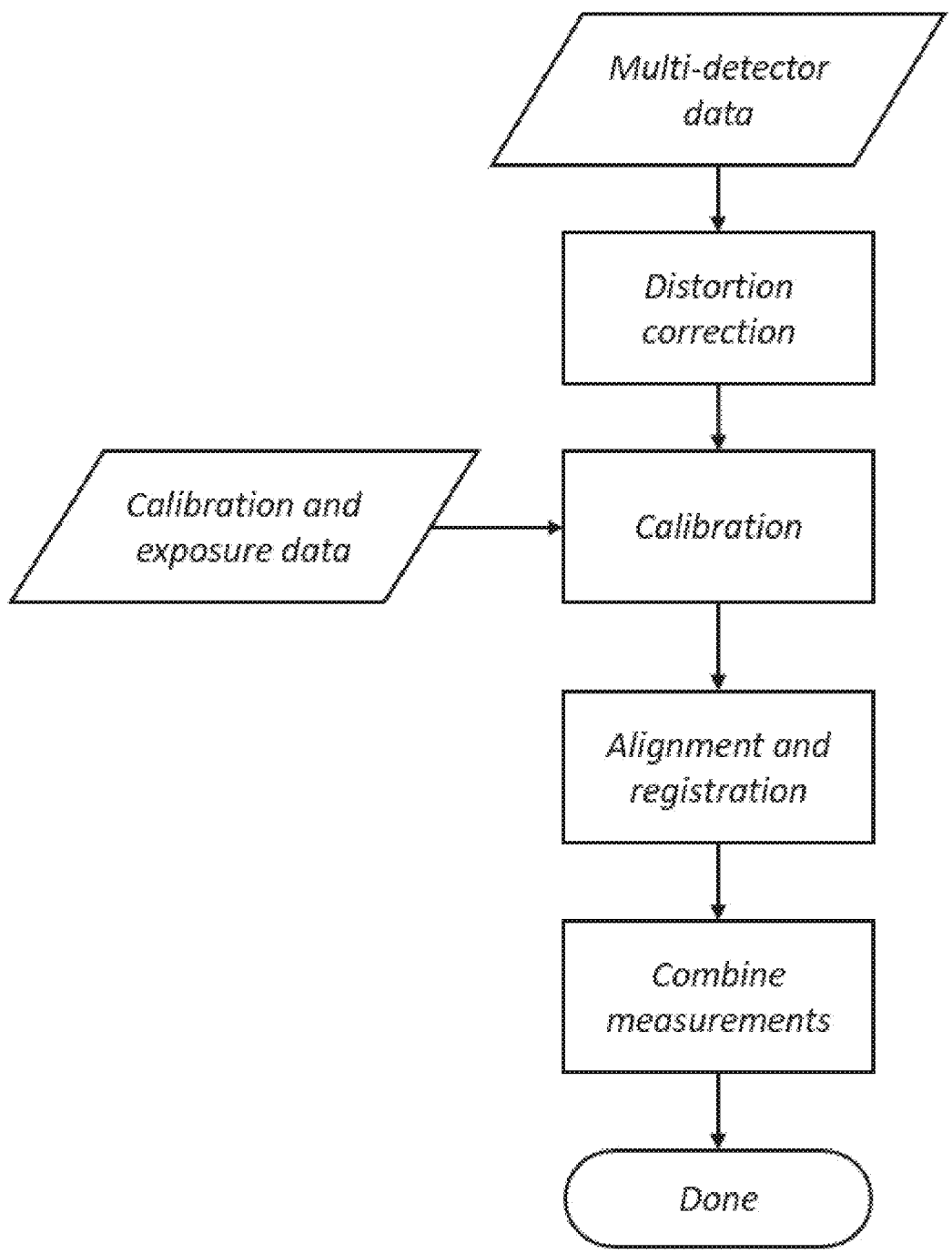
FIG. 8 provides a non-limiting example of a flow chart for a data analysis method used to process multi-detector data sets.

The disclosed methods may also include processor- or computer-implemented algorithms and methods to reconstruct a single measurement (e.g., a single frame of image or diffraction data) from the data read out from multiple detectors (FIG. 8). The detector readouts may be processed by a processor or computer for analysis. The analysis method may include a correction for distortions, including those introduced by the deflector; calibration of incoming data that incorporates the known exposure times and characteristics of each detector; alignment and registration of the data so that the different detector readouts can be spatially overlapped; and performance of a combination of individual measurements that appropriately weight the regions which are over- or under-exposed on a given detector, such that the composite dataset contains the optimal combination of the individual datasets to accurately represent the quantities being measured. The resulting composite dataset has a substantially enhanced dynamic range.

Figure 9:
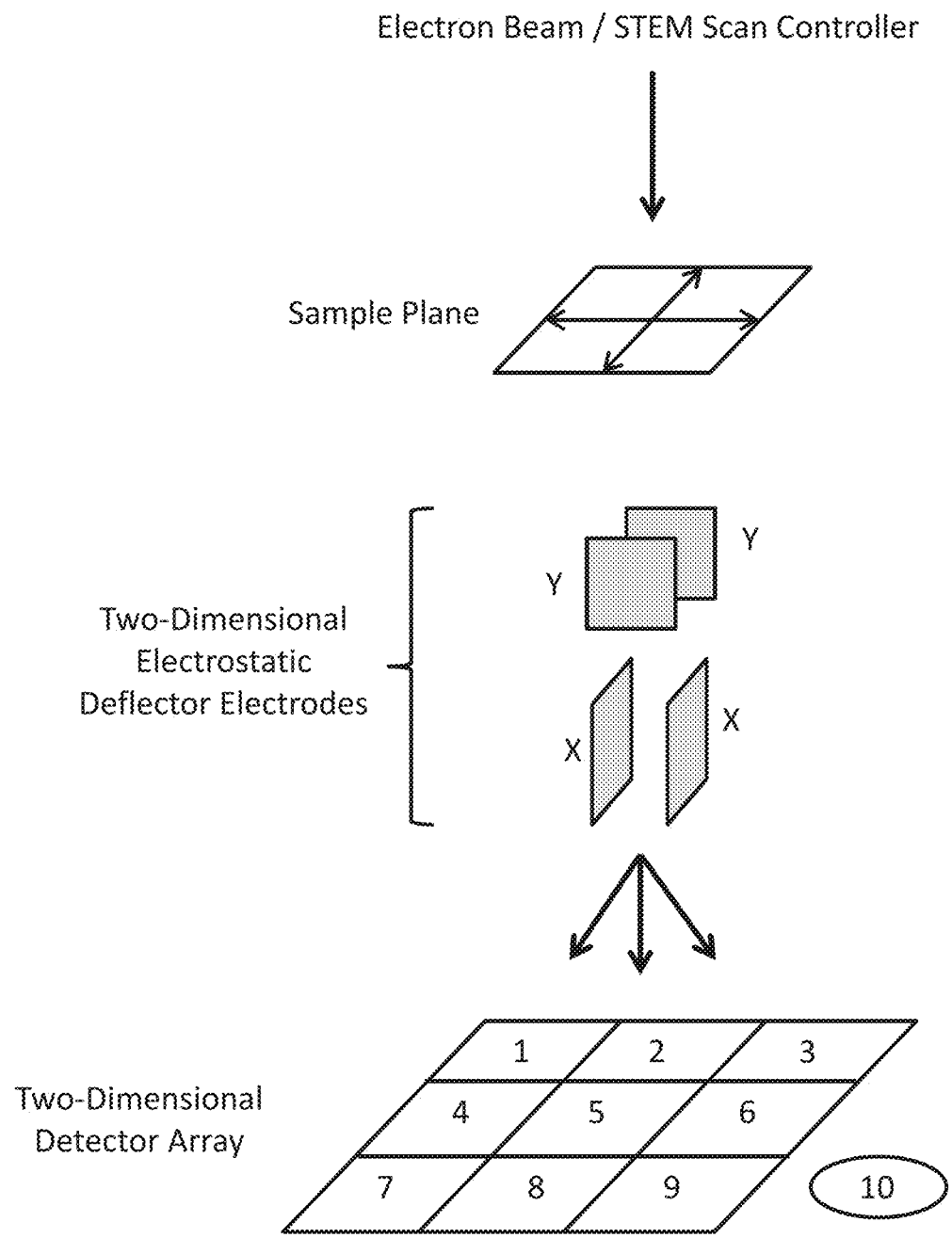
FIG. 9 provides a schematic illustration of a scanning transmission electron microscope (STEM) scan controller combined with a two-dimensional electrostatic deflector to deflect electrons transmitted or scattered by the sample to different detectors or sub-regions of a detector.

FIG. 9 provides a schematic illustration of a scanning transmission electron microscope (STEM) scan controller (which scans an electron beam probe across the sample plane) combined with a two-dimensional electrostatic deflector to deflect electrons transmitted or scattered by the sample to different detectors or sub-regions of a detector. In some instances, the disclosed methods may also be implemented in conventional transmission electron microscopy, i.e., in an operating mode that does not scan the electron probe beam across the sample plane. FIGS. 10A-E provide a non-limiting example of timing diagrams for controlling the electrostatic deflection of electrons in a TEM to expose different sub-regions of a two-dimensional detector or different detectors in a two-dimensional array of detectors. The system hardware used to implement the disclosed high dynamic range data acquisition methods is the same as or similar to that used to implement the high frame rate data acquisition methods described above, e.g., a fast, two-dimensional electrostatic or electromagnetic deflector that has fast switching times and accurate positioning. The relevant timescales for sub-frame/exposure region/detector dwell time are also the same. In some instances, the present disclosure includes a system that combines HDR and HFR operation as described above such that the exposure regions of the camera(s) are synchronized to a readout pattern for the detector or detector array.

The two-dimensional electrostatic deflector system illustrated schematically in FIG. 9 is shown synchronized to a STEM scan controller, which directs an electron beam probe to a sequence of sample locations (usually a square array of between 128×128 pixels and 4096×4096 pixels with uniform dwell times). However, in other implementations the probe pattern could be some arbitrary pattern of locations and/or exposure times on the sample. In some instances, the sub-frame/exposure region/detector deflection sequence may be synchronized to modulations of other parameters of the probe beam beyond its position on the sample, for example, the focus depth or convergence angle. In some instances, the timing synchronization between probe and sub-frame/exposure region/detector deflection sequence may be accomplished by sending a signal from the STEM controller to the deflector controller, or the other way around. In some instances, the signal may correspond to a signal for each STEM probe location, each line in the STEM probe scan, or some initial signal indicating the start of a pre-programmed sequence.

In some instances, the timing synchronization between the camera/detector readouts and the sub-frame/exposure region/detector deflection sequence can be established by control signals sent in either direction between the deflector control system and the cameras/detectors. In some instance, the number of camera sub-frames/exposure regions/detectors which are exposed for each probe location on the sample (or other combination of probe parameters) can vary. In some instances, the number of camera sub-frames/exposure regions/detectors which are exposed for each probe location on the sample (or other combination of probe parameters) can be the same.

As noted, FIGS. 10A-E provide a non-limiting example of timing diagrams for controlling the electrostatic deflection of electrons in a TEM to expose different sub-regions of a two-dimensional detector or different detectors in a two-dimensional array of detectors. FIG. 10A provides a schematic illustration of a sequence of probe beam locations on a sample. The corresponding timing diagram for scanning of the probe beam across the sample is depicted in FIG. 10B. FIG. 10C illustrates an array of 10 detectors or detection regions. In some instances, e.g., detection regions 1-9 may be sub-regions of a single detector, e.g., a CMOS camera, and detection region 10 may comprise a separate detector, e.g., a beam diagnostics sensor. FIG. 10D illustrates a timing diagram for implementing the sequence of exposures illustrated in FIG. 10C, where the exposure time (dwell time) for different detectors/detector regions is different. FIG. 10E illustrates a timing diagram for the voltages applied between pairs of electrodes in a two-dimensional electrostatic deflector to implement the deflection pattern and timing depicted in FIGS. 10C and 10D.

In some instances, for example, the number of camera sub-frames/exposure regions/detectors which are exposed for each probe location on the sample (or other combination of probe parameters) may range from about 2 to about 20. In some instances, the number of camera sub-frames/exposure regions/detectors which are exposed for each probe location on the sample (or other combination of probe parameters) may be at least 2, at least 3, at least 4, at least 5, at least 6, at least 7, at least 8, at least 9, at least 10, at least 15, or at least 20. In some instances, the number of camera sub-frames/exposure regions/detectors which are exposed for each probe location on the sample (or other combination of probe parameters) may be at most 20, at most 15, at most 10, at most 9, at most 8, at most 7, at most 6, at most 5, at most 4, at most 3, or at most 2. Any of the lower and upper values described in this paragraph may be combined to form a range included within the present disclosure, for example, in some instances the number of camera sub-frames/exposure regions/detectors which are exposed for each probe location on the sample (or other combination of probe parameters) may range from about 4 to about 15. In some instances, the number of camera sub-frames/exposure regions/detectors which are exposed for each probe location on the sample (or other combination of probe parameters) may have any value within this range, e.g., about 12. In some instances, the different exposure regions/detectors (e.g., detector regions 1-10 in FIG. 9) may comprise different detectors. In some instances, all or a portion of the different exposure regions/detectors (e.g., detector regions 1-9 in FIG. 9) may comprise sub-regions of a single detector.

In some instances, the enhancement of dynamic range achieved using the disclosed methods and systems may be at least 2×, at least 4×, at least 8×, at least 12×, at least 16×, at least 20×, at least 40×, at least 60×, at least 80×, at least 100×, at least 250×, at least 500×, at least 750×, at least 1,000×, at least 2,000×, at least 3,000×, at least 4,000×, at least 5,000×, or higher. In some instances, the enhancement of dynamic range achieved may be any value within this range, e.g., at least 15×.

As for the high-framerate data acquisition methods described above, different patterns of exposure may be used in acquiring HDR datasets. In some instances, the two-dimensional deflector may be used to deflect electrons to, for example, a pattern of 2×2, 3×3, 4×4, 5×5, 6×6, 7×7, 8×8, 9×9, 10×10, 11×11, 12×12, 13×13, 14×14, 15×15, 16×16, 17×17, 18×18, 19×19, 20×20 different sub-regions or different detectors, or more. In some instances, the two-dimensional deflector may be used to deflect electrons to non-square arrays of sub-regions or detectors, such as 3×4, 6×9, 9×12, 12×15, and so on.

In some instances, the dwell time or duration of exposure for a given probe setting at a given sub-frame/sub-region/exposure region/detector may all be the same or they may differ. In some instances, the duration of the exposure at each sub-region or individual detector within the two-dimensional detector array (i.e., the dwell time for each sub-region or individual detector) may range from about 1 μsec to about 100 msec. In some instances, the dwell time may be at least 1 μsec, at least 10 μsec, at least 100 μsec, at least 1 msec, at least 10 msec, or at least 100 msec. In some instances, the dwell time may be at most 100 msec, at most 10 msec, at most 1 msec, at most 100 μsec, at most 10 μsec, or at most 1 μsec. Any of the lower and upper values described in this paragraph may be combined to form a range included within the present disclosure, for example, in some instances the dwell time may range from about 10 μsec to about 10 msec. In some instances, the dwell time may have any value within this range, e.g., about 1.3 msec.

In some instances, the switching time of the two-dimensional deflector may range from about 1 nsec to about 1 msec. In some instances, the switching time is at least 1 nsec, at least 10 nsec, at least 100 nsec, at least 1 μsec, at least 10 μsec, at least 100 μsec, or at least 1 msec. In some instances, the switching time is at most 1 msec, at most 100 μsec, at most 10 μsec, at most 1 μsec, at most 100 nsec, at most 10 nsec, or at most 1 nsec. Any of the lower and upper values described in this paragraph may be combined to form a range included within the present disclosure, for example, in some instances the switching time may range from about 10 nsec to about 10 μsec. In some instances, the switching time may have any value within this range, e.g., about 1.3 msec. In some instances, the switching times for switching between sub-frames/exposure regions/individual detectors may be equal to one another. In some instances, the switching times may be different, and may be individually adjustable.

The voltage waveforms applied to each pair of deflector electrodes (X and Y pairs) depicted in FIG. 9 may comprise step changes of equal magnitude or different magnitude. In some instances, one plate of each pair may be held at a fixed voltage, or the voltages applied to each pair may differ in magnitude or have the same or opposite sign. In some instances, the magnitude of the voltage waveforms may range from about 0 volts to about 10 kV. In some instances, the magnitude of the voltage waveforms may be at least 0 volts, at least 10 volts, at least 100 volts, at least 500 volts, at least 1,000 volts, at least 5 kV, or at least 10 kV. In some instances, the magnitude of the voltage waveforms may be at most 10 kV, at most 5 kV, at most 1,000 volts, at most 500 volts, at most 100 volts, at most 10 volts, or about 0 volts. Any of the lower and upper values described in this paragraph may be combined to form a range included within the present disclosure, for example, in some instances the magnitude of the voltage waveform may range from about 100 volts to about 1,000 volts. In some instances, the magnitude of the voltage waveform may have any value within this range, e.g., about 1,250 volts. The magnitudes and timing sequences for the voltage waveforms are programmable, and comprise the sequence of four electrode voltages that determine the number of exposure regions, the order in which sub-regions are exposed, and the duration of the exposure at each sub-region (i.e., the dwell time for each sub-region in individual detector).

The deflection of the transmitted or scattered electrons between sub-frames/exposure regions may be accomplished in the system illustrated in FIG. 9 and FIGS. 10A-10E using a sequence of voltages on pairs of electrodes that apply an electric field to a beam of electrons. In other implementations, the electrons may be deflected by, e.g., using magnetic fields generated by a sequence of electrical currents driven through magnetic coils. In yet other implementations, there may be additional electrodes or electromagnets to which voltages or currents are applied, such that image or diffraction data distortions introduced by the deflection process are reduced.

As for the high framerate data acquisition methods and systems described previously, the spatial positioning achieved by the two-dimensional deflector should be sufficiently accurate that the jitter in re-positioning a deflected image or diffraction pattern is less than about the dimensions of a single image sensor pixel. In some instances, the spatial positioning achieved by the two-dimensional deflector is accurate to better than about 500 µm, better than about 450 µm, better than about 400 µm, better than about 350 µm, better than about 300 µm, better than about 250 µm, better than about 200 µm, better than about 150 µm, better than about 100 µm, better than about 90 µm, better than about 80 µm, better than about 70 µm, better than about 60 µm, better than about 50 µm, better than about 40 µm, better than about 30 µm, better than about 20 µm, better than about 10 µm, better than about 9 µm, better than about 8 µm, better than about 7 µm, better than about 6 µm, better than about 5 µm, better than about 4 µm, better than about 3 µm, better than about 2 µm, or better than about 1 µm.

In some instances, the synchronization of the two-dimensional deflector with the read-out cycle of a detector (e.g., a rolling shutter read-out cycle for a CMOS camera) may be accurate to better than 50 msec, better than, 40 msec, better than 30 msec, better than 20 msec, better than 10 msec, better than 9 msec, better than 8 msec, better than 7 msec, better than 6 msec, better than 5 msec, better than 4 msec, better than 3 msec, better than 2 msec, better than 1 msec, better than 900 µsec, better than 800 µsec, better than 700 µsec, better than 600 µsec, better than 500 µsec, better than 400 µsec, better than 300 µsec, better than 200 µsec, better than 100 µsec, better than 90 µsec, better than 80 µsec, better than 70 µsec, better than 60 µsec, better than 50 µsec, better than 40 µsec, better than 30 µsec, better than 20 µsec, better than 10 µsec, better than 9 µsec, better than 8 µsec, better than 7 µsec, better than 6 µsec, better than 5 µsec, better than 4 µsec, better than 3 µsec, better than 2 µsec, better than 1 µsec, better than 900 nsec, better than 800 nsec, better than 700 nsec, better than 600 nsec, better than 500 nsec, better than 400 nsec, better than 300 nsec, better than 200 nsec, or better than 100 nsec.

In some instances, the camera/detector exposure sequence for a given set of probe parameters (e.g., position on sample) could differ from those used for a different set of probe parameters. In some instances, during transitions between certain sets of probe parameters, the diffraction data may be blurry or invalid. In such instances, the deflectors may be used to direct the data to a region of the detector that will be ignored, or to a location where no detector is located.

In some instances, the disclosed methods (and systems configured to implement them) may include processor- or computer-implemented algorithms and methods to process the acquired data and generate high dynamic range image or video data. For example, in some instances the processor- or computer-implemented algorithms and methods may: (i) segment the raw camera read-out data into sub-frames containing individual diffraction patterns or images, (ii) correct for distortions introduced by the deflection process, and (iii) combine relevant series/groups of sub-frames together, where each series contains data from two or more sub-frames which have identical measurement parameters except for their exposure times, to produce an individual pattern or image which has enhanced dynamic range. In some instances, these processing steps may utilize pre-processed calibration data from the same sample as that for which the image data or diffraction data has been acquired. In some instances, these processing steps may utilize pre-processed calibration data for a different sample measured under similar conditions. In some instances, the processor- or computer-implemented algorithms and methods may perform additional processing steps such as: (i) combining different detection channels (e.g., datasets from different types of detectors to create multimodal datasets, (ii) fine-tuning the alignment of sub-frames by identifying consistent features within the sub-frame data itself, (iii) using the fine-tuning of sub-frame alignment to correct for sample drift during the measurement, (iv) filtering to remove noise using prior knowledge of the sample or physical system under measurement, the characteristics of the detector, and/or the optics themselves, and/or (v) inferring data from regions of the detector array which have been exposed multiple times during a single readout cycle.

High Dynamic Range Optical Microscopy and Imaging:

Although described primarily in the context of data capture for high dynamic range transmission electron microscopy, the methods described above may also be applied to optical microscopy and imaging applications. For example, a fast, two-dimensional deflector suitable for deflection of photons rather than electrons may be used to deflect patterns of photons that have been transmitted, reflected, and/or scattered by a sample or object to a series of two or more sub-regions of a two-dimensional detector (e.g., a CMOS or CCD image sensor) or a two-dimensional array of individual detectors. Examples of suitable two-dimensional deflectors for deflecting photons include, but are not limited to, rotating mirrors, rotating prisms, etc. CMOS or CCD cameras, or other detectors that have been designed and optimized for use with ultraviolet, visible, or infrared light would be chosen rather than those designed and optimized for detection of electrons.

As for the high dynamic range transmission electron microscopy methods described above, the precise adjustment of dwell times (exposure times) for each of the sub-regions or individual detectors and/or adjustment of the sensitivity and/or saturation level for each of the sub-regions or individual detectors enables the acquisition of a series of images that may be processed to produce a single image frame having higher dynamic range than is achievable using a single detector. In some instances, precise and continuous synchronization of a two-dimensional deflector modulation control signal with a continuous read-out mode of the two-dimensional detector, e.g., a rolling shutter mode for a CMOS camera, enables the exposure of a series of two or more sub-regions of the detector that are not actively being read out at the time of exposure, and further processing of the image frames acquired by each of the sub-regions or individual detectors may then be used be used to assemble continuous high dynamic range video data having a framerate that is significantly higher than the read-out rate for the CMOS camera or two-dimensional detector array. In some instances, the HDR systems disclosed herein may be configured to modulate the magnification as well as the position of the deflected photon pattern on the camera. In some instances, the magnification of the deflected photon pattern may be at least 2×, 4×, 8×, 16×, or 32× that of the non-magnified deflected photon pattern.

As for the high framerate transmission electron microscopy methods described above, the number of camera sub-frames/exposure regions/detectors which are exposed by deflection of photons transmitted, reflected, or scattered by a sample or object within the read-out cycle for a single detector or array of detectors may range from about 2 to about 20. In some instances, the number of camera sub-frames/exposure regions/detectors which are exposed may be at least 2, at least 3, at least 4, at least 5, at least 6, at least 7, at least 8, at least 9, at least 10, at least 15, or at least 20. In some instances, the number of camera sub-frames/exposure regions/detectors which are exposed may be at most 20, at most 15, at most 10, at most 9, at most 8, at most 7, at most 6, at most 5, at most 4, at most 3, or at most 2. Any of the lower and upper values described in this paragraph may be combined to form a range included within the present disclosure, for example, in some instances the number of camera sub-frames/exposure regions/detectors which are exposed may range from about 4 to about 15. In some instances, the number of camera sub-frames/exposure regions/detectors which are exposed may have any value within this range, e.g., about 14.

In some instances, the enhancement of dynamic range achieved using the disclosed methods and systems may be at least 2×, at least 4×, at least 8×, at least 12×, at least 16×, at least 20×, at least 40×, at least 60×, at least 80×, at least 100×, at least 250×, at least 500×, at least 750×, at least 1,000×, at least 2,000×, at least 3,000×, at least 4,000×, at least 5,000×, or higher. In some instances, the enhancement of dynamic range achieved may be any value within this range, e.g., at least 17×.

In some instances, the optical HDR systems disclosed herein may be configured to modulate the magnification as well as the position of the deflected photons or image on the camera or detector array. In some instances, the magnification of the deflected photons (e.g., a diffraction pattern or image) may be at least 2×, 4×, 8×, 16×, or 32× that of the non-magnified deflected diffraction pattern or image.

In some instances, the two-dimensional deflector may be used to deflect photons to, for example, a pattern of 2×2, 3×3, 4×4, 5×5, 6×6, 7×7, 8×8, 9×9, 10×10, 11×11, 12×12, 13×13, 14×14, 15×15, 16×16, 17×17, 18×18, 19×19, 20×20 sub-regions, or more. In some instances, the two-dimensional deflector may be used to deflect photons to non-square arrays of sub-regions, such as 3×4, 6×9, 9×12, 12×15, and so on. In some instances, the two-dimensional deflector may be used to deflect photons to, for example, a pattern of 2×2, 3×3, 4×4, 5×5, 6×6, 7×7, 8×8, 9×9, 10×10, 11×11, 12×12, 13×13, 14×14, 15×15, 16×16, 17×17, 18×18, 19×19, 20×20, or more different detectors in the two-dimensional detector array. In some instances, the two-dimensional deflector may be used to deflect photons to non-square arrays of individual detectors, such as 3×4, 6×9, 9×12, 12×15 detectors, and so on.

In some instances, the sub-frames or sub-regions (i.e., the exposure regions) may be, e.g., adjacent rectangular regions. In some instances, they may be non-rectangular and/or non-adjacent. In some instances, the deflected beam may be projected through a circular aperture thereby resulting in projecting an array of circular images on the camera. In some instances, there may be gaps between the exposure regions consisting of pixels that are never exposed during a sequence. In some instances, there may be overlaps between the exposure regions, such that certain pixels are exposed multiple times before they are read out.

In some instances, the order of exposing the different sub-frames/sub-regions of the camera may be any pattern that avoids exposing the specific region of the camera which is actively being read out. For example, in some instances a sinusoidal pattern may be used to achieve minimum switching times. In some instances, the order of exposures within each row of sub-regions might be shuffled. In some instances, the sub-frame exposure sequence may or may not be the same for each camera readout cycle. In some instances, each sub-frame may be exposed exactly once for a given camera readout cycle. In other instances, certain sub-frames may be exposed multiple times. Such an exposure sequence may or may not be used in implementing a compressive sensing data acquisition mode. In some instances, certain sub-frames may be skipped to create a fiducial mark in time to facilitate interpretation of the data.

In some instance, the duration of the exposure at each sub-region or individual detector within the two-dimensional detector array (i.e., the dwell time for each sub-region or individual detector) may range from about 1 μsec to about 100 msec. In some instances, the dwell time may be at least 1 μsec, at least 10 μsec, at least 100 μsec, at least 1 msec, at least 10 msec, or at least 100 msec. In some instances, the dwell time may be at most 100 msec, at most 10 msec, at most 1 msec, at most 100 μsec, at most 10 μsec, or at most 1 μsec. Any of the lower and upper values described in this paragraph may be combined to form a range included within the present disclosure, for example, in some instances the dwell time may range from about 10 μsec to about 10 msec. In some instances, the dwell time may have any value within this range, e.g., about 1.3 msec. In some instances, the dwell times for each sub-frame/exposure region/individual detector may be equal to one another. In some instances, the dwell times for each sub-frame/exposure region/individual detector may be different from one another and may be individually adjustable.

In some instances, the methods and systems described herein are configured to provide for high duty cycle operation without incurring temporal distortion of the data. In some instances, the duty cycle may be at least 85%, at least 90%, at least 95%, at least 98%, or at least 99% without incurring temporal distortion of the data.

In general, the switching speed of the two-dimensional deflector should be fast compared to the dwell times used for exposure of sub-regions or individual detectors in order to minimize temporal distortions, i.e., so that there is no blurring between frames. In some instances, the switching time of the two-dimensional deflector may range from about 1 nsec to about 1 msec. In some instances, the switching time is at least 1 nsec, at least 10 nsec, at least 100 nsec, at least 1 µsec, at least 10 µsec, at least 100 µsec, or at least 1 msec. In some instances, the switching time is at most 1 msec, at most 100 µsec, at most 10 µsec, at most 1 µsec, at most 100 nsec, at most 10 nsec, or at most 1 nsec. Any of the lower and upper values described in this paragraph may be combined to form a range included within the present disclosure, for example, in some instances the switching time may range from about 10 nsec to about 10 µsec. In some instances, the switching time may have any value within this range, e.g., about 1.3 msec. In some instances, the switching times for switching between sub-frames/exposure regions/individual detectors may be equal to one another. In some instances, the switching times may be different, and may be individually adjustable.

In some instances, the spatial positioning achieved by the two-dimensional optical deflector should be sufficiently accurate that the jitter in re-positioning a deflected image is less than about the dimensions of a single image sensor pixel. In some instances, the spatial positioning achieved by the two-dimensional optical deflector is accurate to better than about 500 µm, better than about 450 µm, better than about 400 µm, better than about 350 µm, better than about 300 µm, better than about 250 µm, better than about 200 µm, better than about 150 µm, better than about 100 µm, better than about 90 µm, better than about 80 µm, better than about 70 µm, better than about 60 µm, better than about 50 µm, better than about 40 µm, better than about 30 µm, better than about 20 µm, better than about 10 µm, better than about 9 µm, better than about 8 µm, better than about 7 µm, better than about 6 µm, better than about 5 µm, better than about 4 µm, better than about 3 µm, better than about 2 µm, or better than about 1 µm.

In some instances, the synchronization of the two-dimensional deflector with the read-out cycle of a detector (e.g., a rolling shutter read-out cycle for a CMOS camera) may be accurate to better than 50 msec, better than, 40 msec, better than 30 msec, better than 20 msec, better than 10 msec, better than 9 msec, better than 8 msec, better than 7 msec, better than 6 msec, better than 5 msec, better than 4 msec, better than 3 msec, better than 2 msec, better than 1 msec, better than 900 µsec, better than 800 µsec, better than 700 µsec, better than 600 µsec, better than 500 µsec, better than 400 µsec, better than 300 µsec, better than 200 µsec, better than 100 µsec, better than 90 µsec, better than 80 µsec, better than 70 µsec, better than 60 µsec, better than 50 µsec, better than 40 µsec, better than 30 µsec, better than 20 µsec, better than 10 µsec, better than 9 µsec, better than 8 µsec, better than 7 µsec, better than 6 µsec, better than 5 µsec, better than 4 µsec, better than 3 µsec, better than 2 µsec, better than 1 µsec, better than 900 nsec, better than 800 nsec, better than 700 nsec, better than 600 nsec, better than 500 nsec, better than 400 nsec, better than 300 nsec, better than 200 nsec, or better than 100 nsec.

As for the high dynamic range electron microscopy methods and systems discussed above, in some instances the disclosed optical HDR methods (and systems configured to implement them) may include processor- or computer-implemented algorithms and methods to process the acquired data and generate high dynamic range diffraction pattern, image, or video data. For example, in some instances the processor- or computer-implemented algorithms and methods may: (i) segment the raw camera read-out data into sub-frames containing individual diffraction patterns or images, (ii) correct for distortions introduced by the deflection process, and (iii) combine relevant series/groups of sub-frames together, where each series contains data from two or more sub-frames which have identical measurement parameters except for their exposure times, to produce an individual pattern or image which has enhanced dynamic range. In some instances, these processing steps may utilize pre-processed calibration data from the same sample as that for which the image data has been acquired. In some instances, these processing steps may utilize pre-processed calibration data for a different sample measured under similar conditions. In some instances, the processor- or computer-implemented algorithms and methods may perform additional processing steps such as: (i) combining different detection channels (e.g., datasets from different types of detectors to create multimodal datasets, (ii) fine-tuning the alignment of sub-frames by identifying consistent features within the sub-frame data itself, (iii) using the fine-tuning of sub-frame alignment to correct for sample drift during the measurement, (iv) filtering to remove noise using prior knowledge of the sample or physical system under measurement, the characteristics of the detector, and/or the optics themselves, and/or (v) inferring data from regions of the detector array which have been exposed multiple times during a single readout cycle.

In some instances, the disclosed methods for acquisition of high dynamic range optical image data may be implemented in the context of optical microscopy for imaging cells or other microscopic structures. In some instances, the disclosed methods for acquisition of high dynamic range optical image data may be implemented in the context of high speed video cameras for imaging moving objects.

HFR and HDR Systems and System Components:

In general, the electron microscope systems for acquisition of high-framerate and/or high dynamic range electron microscopy data (e.g., image data and/or diffraction data) disclosed herein may comprise: a transmission electron microscope (TEM) or scanning transmission electron microscope (STEM); a fast, two-dimensional electron deflector; a deflector control module; a two-dimensional detector or two-dimensional array of detectors (which in some instances may comprise a CMOS camera or other detector configured with a rolling shutter read-out mode); a processor or computer; or any combination thereof. In some instances, the disclosed electron microscopy systems may further comprise software for: (i) assembling high framerate video data from a plurality of sub-region or individual detector data sets acquired during a single detector or detector array read-out cycle and/or for (ii) processing data acquired from each of a plurality of detector sub-regions or individual detectors to compile high dynamic range images. In general, the optical systems for acquisition of high-framerate and/or high dynamic range optical data (e.g., image data and/or diffraction data) may comprise: an optical system configured to collect light transmitted, reflected, or scattered by a sample or object and image it onto a two dimensional detector or detector array; a fast, two-dimensional photon deflector; a deflector control module; a two-dimensional detector or two-dimensional array of detectors (which in some instances may comprise a CMOS camera or other detector configured with a rolling shutter read-out mode); a processor or computer, or any combination thereof. In some instances the disclosed optical systems may further comprise software for: (i) assembling high framerate video data from a plurality of sub-region or individual detector data sets acquired during a single detector or detector array read-out cycle and/or for (ii)

processing data acquired from each of a plurality of detector sub-regions or individual detectors to compile high dynamic range images.

Two-Dimensional Deflectors:

Examples of suitable two-dimensional electron deflectors for use in the disclosed methods and systems include, but are not limited to, two-dimensional electrostatic deflectors, two-dimensional electromagnetic deflectors, or a combination thereof. In some instances of the disclosed systems, two or more two-dimensional electrostatic and/or electromagnetic deflectors may be combined to implement a deflection system having three-dimensional deflection capabilities.

Examples of suitable two-dimensional photon deflectors for use in the disclosed methods and systems include, but are not limited to, sets of rotating mirrors, sets of rotating prisms, mirrors or prisms configured to translate along a linear path (e.g., motorized mirrors or prisms), or a combination thereof.

Deflector Control Module:

In some instances, the disclosed systems may comprise a deflector control module configured to: (i) control the switching times for switching deflected electrons or photons from one sub-region or detector to another, (ii) control the dwell times for exposing one or more sub-regions or detectors to the deflected electrons or photons, (iii) synchronize the deflection pattern with a read-out signal or read-out cycle for a two dimensional detector or detector array, and/or (iv) synchronize any of the aforementioned parameters with a control signal for another experimental parameter, e.g., the positioning of a probe beam on a sample.

Detectors:

Examples of suitable detectors for use in the disclosed methods and systems include, but are not limited to, charge-coupled device (CCD) image sensors and cameras, complementary metal oxide semiconductor (CMOS) image sensors and cameras, electron direct detection (EDD) image sensors and cameras (i.e., CCD or CMOS image sensors which have been modified to include a layer that emits photons when struck by an electron, or to detect electrons directly), time-of-flight (ToF) image sensors and cameras, dark-field STEM detectors, Faraday cups, quad photodiodes, annular dark field detectors, bright field detectors, universal detectors, or any combination thereof.

In some instances, e.g., where an array of detectors is used, the different detectors of the array may have different readout modes and/or sensitivities optimized for different electron or photon intensities. In some instances, the different detectors may have different levels of protection from radiation damage. In some instances, different detectors may have different objects placed in the path between the sample or object and the individual detector, e.g., to selectively occlude the bright central spot which is present in diffraction pattern data. In some instances, some of the detectors in an array of detectors may be optimized to collect diagnostic, calibration, or alignment data which is qualitatively different from the data acquired by other detectors in the array.

Processors and Computers:

In some instances, the disclosed systems may comprise one or more processors, computers, or computer systems configured for control and synchronization of the fast, two-dimensional deflector with the read-out of a single detector or array of detectors, as well as the storage, processing, analysis, and display of the acquired image data. In some instances, the one or more processors, computers, and computer systems may be configured for control of other system functions and/or other data acquisition, storage, processing, analysis, or display functions as well.

Figure 11:
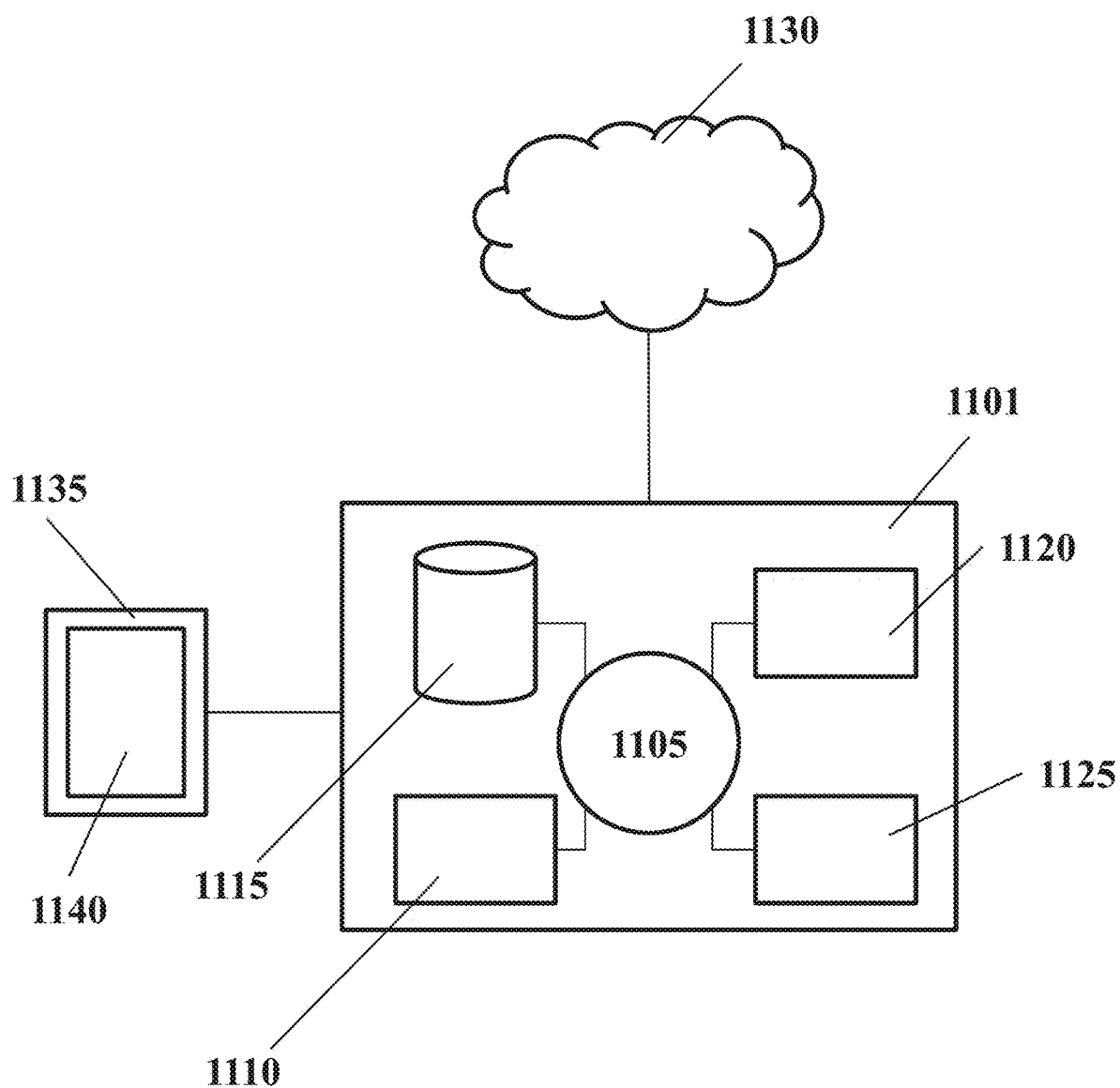
FIG. 11 provides a schematic illustration of a computer system that is programmed or otherwise configured to implement the methods and systems provided herein.

FIG. 11 provides a schematic illustration of a computer system 1101 that is programmed or otherwise configured to implement the methods described elsewhere herein (e.g., methods for acquiring high framerate and/or high dynamic range electron microscopy data). The computer system 1101 can regulate various aspects of the disclosed methods and systems, such as, for example, the acquisition and processing of diffraction pattern data, image data, or any combination thereof. The computer system 1101 may comprise a local computer system, an electronic device (e.g., a smartphone, laptop, or desktop computer) of a user, or an electronic device of a user that is in communication with a computer system that is remotely located with respect to the electronic device. The computer system 1101 may be a post-classical computer system (e.g., a quantum computing system).

The computer system 1101 includes a central processing unit (CPU, also referred to as a "processor" or "computer processor" herein) 1105, which can be a single core or multi core processor, or a plurality of processors for parallel processing. The computer system 1101 also includes memory or a memory location 1110 (e.g., random-access memory, read-only memory, flash memory), electronic storage unit 1115 (e.g., a hard disk), a communication interface 1120 (e.g., a network adapter) for communicating with one or more other systems, and peripheral devices 1125, such as cache, other memory, data storage and/or electronic display adapters. The memory 1110, storage unit 1115, interface 1120 and peripheral devices 1125 are in communication with the CPU 1105 through a communication bus (solid lines), such as a motherboard. The storage unit 1115 can be a data storage unit (or data repository) for storing data. The computer system 1101 can be operatively coupled to a computer network ("network") 1130 with the aid of the communication interface 1120. The network 1130 may be the Internet, an internet and/or extranet, or an intranet and/or extranet that is in communication with the Internet. The network 1130 in some cases is a telecommunication and/or data network. The network 1130 can include one or more computer servers, which can enable distributed computing, such as cloud computing. The network 1130, in some cases with the aid of the computer system 1101, can implement a peer-to-peer network, which may enable devices coupled to the computer system 1101 to behave as a client or a server.

The CPU 1105 is configured to execute a sequence of machine-readable instructions, which can be embodied in a program or software. The instructions may be stored in a memory location, such as the memory 1110. The instructions can be directed to the CPU 1105, which can subsequently program or otherwise configure the CPU 1105 to implement methods of the present disclosure. Examples of operations performed by the CPU 1105 can include fetch, decode, execute, and writeback.

The CPU 1105 may be part of a circuit, such as an integrated circuit. One or more other components of the system 1101 may be included in the circuit. In some cases, the circuit is an application specific integrated circuit (ASIC).

The storage unit 1115 is configured to store files, such as drivers, libraries and saved programs. The storage unit 1115 may store user data, e.g., user preferences and user programs. The computer system 1101 in some cases can include one or more additional data storage units that are external to the computer system 1101, such as data storage units located on a remote server that is in communication with the computer system 1101 through an intranet or the Internet.

The computer system 1101 may communicate with one or more remote computer systems through the network 1130. For instance, the computer system 1101 may communicate with a remote computer system of a user (e.g., a cloud server). Examples of remote computer systems include personal computers (e.g., a desktop PC), portable personal computers (e.g., a laptop or tablet PC), smart phones (e.g., Apple® iPhone, Android-enabled devices, etc.), or personal digital assistants. The user may access the computer system 1101 via the network 1130.

Software & Algorithms:

As discussed above, in some instances, the disclosed systems may further comprise software for: (i) assembling high framerate video data from a plurality of sub-region or individual detector data sets acquired during a single detector or detector array read-out cycle and/or for (ii) processing data acquired from each of a plurality of detector sub-regions or individual detectors to compile high dynamic range images.

In some instances, the methods described herein may be implemented by way of machine (e.g., computer processor) executable code stored on an electronic storage location of a computer system such as that illustrated in FIG. 11 (such as, for example, in memory 1110 or electronic storage unit 1115 of computer system 1101). The machine executable or machine-readable code can be provided in the form of software. During use, the code can be executed by the processor 1105. In some cases, the code can be retrieved from the storage unit 1115 and stored on the memory 1110 for ready access by the processor 1105. In some situations, the electronic storage unit 1115 can be precluded, and machine-executable instructions are stored on memory 1110.

In some instances, the code can be pre-compiled and configured for use with a machine having a processer adapted to execute the code. In some instances, the code may be compiled during runtime. The code can be supplied in a programming language that can be selected to enable the code to execute in a pre-compiled or as-compiled fashion.

Aspects of the methods and systems provided herein, such as the computer system 1101, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such as in memory (e.g., read-only memory, random-access memory, flash memory) or on a hard disk. "Storage" type media can include any or all of the tangible memory of the computer system, computer processors, or the like, or associated modules thereof, such as various semiconductor memory devices, tape drives, disk drives, optical drives, and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer system or the like that may be used to implement databases. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

The computer system 1101 may include or be in communication with an electronic display 1135 that comprises a user interface (UI) 1140 for providing, for example, an interface for a user to input instructions, upload data to a computer database, download data from a computer database, etc. Examples of UI's include, without limitation, a graphical user interface (GUI) and web-based user interface.

In some instances, the methods and systems of the present disclosure may be implemented through the use of one or more algorithms, e.g., an algorithm comprising instructions for acquiring and/or processing diffraction pattern data, image data, and the like. An algorithm can be implemented by way of software upon execution by the central processing unit 1105.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in any combination in practicing the invention. It is intended that the following claims define the scope of the invention and that methods and structures within the scope of these claims and their equivalents be covered thereby.

What is claimed is:

1. A system for acquiring transmission electron microscopy data, the system comprising:
   a transmission electron microscope including a two-dimensional deflector configured to deflect electrons transmitted or scattered by a sample positioned at a sample plane and a two-dimensional detector array including two or more sub-regions, each sub-region configured to detect a portion of the electrons; and a controller configured to modulate a deflector control signal such that the electrons are sequentially deflected to the two or more sub-regions of the two-dimensional detector array and to synchronize modulation of the deflector control signal with a detector array readout cycle and a shutter synchronization signal such that the electrons are directed to a sub-region within the two or more sub-regions that is not actively being read out.

2. The system of claim 1, wherein the two-dimensional deflector is a two-dimensional electrostatic deflector or a two-dimensional electromagnetic deflector.

3. The system of claim 1, wherein the two-dimensional detector array comprises a charge-coupled device (CCD) image sensor, a complementary metal oxide semiconductor (CMOS) image sensor, an electron direct detection (EDD) camera, or a time-of-flight (ToF) image sensor.

4. The system of claim 1, wherein the two-dimensional detector array includes a plurality of individual detectors.

5. The system of claim 4, wherein the two or more sub-regions of the two-dimensional detector array include distinct detectors of the plurality of individual detectors.

6. The system of claim 5, wherein the distinct detectors have different sensitivity levels or detection capabilities.

7. The system of claim 1, wherein a switching time for the two-dimensional deflector is less than 10 microseconds.

8. The system of claim 1, wherein the deflector control signal is configured to modulate such that a dwell time for deflecting the electrons to each of the two or more sub-regions is different for at least one of the two or more sub-regions.

9. The system of claim 1, wherein a dwell time for deflecting the electrons to the series of two or more sub-regions ranges from about 1 microsecond to about 100 milliseconds.

10. The system of claim 1, wherein a duty cycle for acquiring the transmission electron microscope data is at least 90% without incurring temporal distortion of the transmission electron microscope data.

11. The system of claim 1, wherein the controller is further configured to collect a plurality of frames of image or diffraction data and to process the plurality of frames of image or diffraction data for the two or more sub-regions, wherein the processed data is used to create video data having a framerate at least 4× faster than a read-out rate of the two-dimensional detector array.

12. The system of claim 1, wherein the two-dimensional deflector includes a first electrode and a second electrode, wherein at least one of the first electrode and second electrode is configured to be held at a fixed voltage.

13. The system of claim 1, wherein the two-dimensional deflector includes a first electrode and a second electrode, wherein at least one of the first electrode and second electrode is configured to differ in magnitude or have the same or opposite sign as another electrode.

14. The system of claim 1, wherein the deflector control signal is programmable to specify a number of exposure regions, an order in which sub-regions are exposed, and a duration of exposure at each sub-region.

15. The system of claim 1, further including a second deflector configured to reduce image or diffraction data distortion.

16. The system of claim 1, wherein the transmission electron microscope data captured by each of the series of two or more sub-regions includes a frame of image or diffraction data.

17. The system of claim 1, wherein the modulation synchronization is based on at least one of a sample position, a focus depth, and a convergence angle.

18. The system of claim 1, wherein the modulation synchronization is initiated by a sending of the deflector control signal or the shutter synchronization signal to a controller.

19. A system for acquiring transmission electron microscopy data, the system comprising:
a transmission electron microscope including a two-dimensional detector array having two or more sub-regions, the transmission electron microscope configured to transmit electrons towards a sample in a sample plane and the two-dimensional detector array; and
a two-dimensional deflector configured to deflect the transmitted or scattered electrons by the sample to the two or more sub-regions of the two-dimensional detector array, wherein the deflection is synchronized with a series of recurring detector array read-out cycles, wherein the deflection of the transmitted electrons or scattered by the sample are directed to sub-regions that are not actively being read out.

20. The system of claim 19, wherein the two-dimensional deflector is a two-dimensional electrostatic deflector or a two-dimensional electromagnetic deflector.

21. The system of claim 19, wherein the two-dimensional detector array comprises a charge-coupled device (CCD) image sensor, a complementary metal oxide semiconductor (CMOS) image sensor, an electron direct detection (EDD) camera, or a time-of-flight (ToF) image sensor.

22. The system of claim 1, wherein a switching time for the two-dimensional deflector is less than 10 microseconds.

23. The system of claim 1, wherein the two-dimensional deflector includes a first electrode and a second electrode, wherein at least one of the first electrode and second electrode is configured to be held at a fixed voltage.

* * * * *